United States Patent
Daubert

(10) Patent No.: US 8,890,518 B2
(45) Date of Patent: Nov. 18, 2014

(54) ARRANGEMENTS FOR SELF-TESTING A CIRCULAR VERTICAL HALL (CVH) SENSING ELEMENT AND/OR FOR SELF-TESTING A MAGNETIC FIELD SENSOR THAT USES A CIRCULAR VERTICAL HALL (CVH) SENSING ELEMENT

(75) Inventor: Steven Daubert, Bedford, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 522 days.

(21) Appl. No.: 13/155,731

(22) Filed: Jun. 8, 2011

(65) Prior Publication Data
US 2012/0313635 A1    Dec. 13, 2012

(51) Int. Cl.
G01R 33/06    (2006.01)
G01R 33/07    (2006.01)
G01R 33/00    (2006.01)

(52) U.S. Cl.
CPC .......... *G01R 33/0029* (2013.01); *G01R 33/077* (2013.01)
USPC ...................................... 324/251; 324/207.2

(58) Field of Classification Search
USPC ............................................. 324/251, 207.2
See application file for complete search history.

(56) References Cited

U.S. PATENT DOCUMENTS

| | | |
|---|---|---|
| 4,668,914 A | 5/1987 | Kersten et al. |
| 4,761,569 A | 8/1988 | Higgs |
| 4,829,352 A | 5/1989 | Popovic et al. |
| 5,541,506 A | 7/1996 | Kawakita et al. |
| 5,572,058 A | 11/1996 | Biard |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |
| 6,064,199 A | 5/2000 | Walter et al. |
| 6,064,202 A | 5/2000 | Steiner et al. |
| 6,091,239 A | 7/2000 | Vig et al. |
| 6,100,680 A | 8/2000 | Vig et al. |
| 6,166,535 A | 12/2000 | Irle et al. |
| 6,232,768 B1 | 5/2001 | Moody et al. |

(Continued)

FOREIGN PATENT DOCUMENTS

DE    10 2005 014 509 B4    10/2006
DE    10 2006 037 226 A1    2/2008

(Continued)

OTHER PUBLICATIONS

Allegro Microsystems, Inc.; "High Precision Linear Hall Effect Sensor IC with a Push/Pull, Pulse Width Modulated Output;" A1351; pp. 1-23.

(Continued)

*Primary Examiner* — Reena Aurora
(74) *Attorney, Agent, or Firm* — Daly, Crowley, Mofford & Durkee, LLP

(57) ABSTRACT

A switching arrangement around a circular vertical Hall (CVH) sensing element can provide a normal mode configuration responsive to magnetic fields at some times, and at least one of a first and a second self-test mode configuration not responsive to a magnetic field but simulating a magnetic field at other times. A corresponding method is also described.

48 Claims, 12 Drawing Sheets

(56) References Cited

U.S. PATENT DOCUMENTS

| | | | |
|---|---|---|---|
| 6,236,199 | B1 | 5/2001 | Irle et al. |
| 6,265,864 | B1 | 7/2001 | De Winter et al. |
| 6,288,533 | B1 | 9/2001 | Haeberli et al. |
| 6,297,627 | B1 | 10/2001 | Towne et al. |
| 6,356,741 | B1 | 3/2002 | Bilotti et al. |
| 6,525,531 | B2 | 2/2003 | Forrest et al. |
| 6,542,068 | B1 | 4/2003 | Drapp et al. |
| 6,545,462 | B2 | 4/2003 | Schott et al. |
| 6,622,012 | B2 | 9/2003 | Bilotti et al. |
| 6,768,301 | B1 | 7/2004 | Hohe et al. |
| 6,969,988 | B2 | 11/2005 | Kakuta et al. |
| 7,030,606 | B2 | 4/2006 | Kato et al. |
| 7,038,448 | B2 | 5/2006 | Schott et al. |
| 7,085,119 | B2 | 8/2006 | Bilotti et al. |
| 7,119,538 | B2 | 10/2006 | Blossfeld |
| 7,159,556 | B2 | 1/2007 | Yoshihara |
| 7,235,968 | B2 | 6/2007 | Popovic et al. |
| 7,259,556 | B2 | 8/2007 | Popovic et al. |
| 7,307,824 | B2 | 12/2007 | Bilotti et al. |
| 7,362,094 | B2 | 4/2008 | Voisine et al. |
| 7,714,570 | B2 | 5/2010 | Thomas et al. |
| 7,746,065 | B2 | 6/2010 | Pastre et al. |
| 7,759,929 | B2 | 7/2010 | Forsyth |
| 7,872,322 | B2 | 1/2011 | Schott et al. |
| 7,911,203 | B2 | 3/2011 | Thomas et al. |
| 7,965,076 | B2 | 6/2011 | Schott |
| 7,994,774 | B2 | 8/2011 | Thomas et al. |
| 2006/0011999 | A1 | 1/2006 | Schott et al. |
| 2007/0029998 | A1 | 2/2007 | Popovic et al. |
| 2009/0121707 | A1 | 5/2009 | Schott |
| 2009/0174395 | A1 | 7/2009 | Thomas et al. |
| 2010/0156397 | A1 | 6/2010 | Yabusaki et al. |
| 2010/0164491 | A1 | 7/2010 | Kejik et al. |
| 2011/0018533 | A1 | 1/2011 | Cesaretti et al. |
| 2011/0248708 | A1 | 10/2011 | Thomas et al. |

FOREIGN PATENT DOCUMENTS

| | | |
|---|---|---|
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |

OTHER PUBLICATIONS

Allegro Microsystems, Inc.; "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.

Kejik,.et al.; "Ultra Low-Power Angular Position Sensor for High-Speed Portable Applications;" 2009 IEEE Sensors Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSIC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-axis Magnetic Sensor, with I$^2$C Interface;" Aug. 14, 2008; 9 pages.

MEMSIC Corporation; MMC314xMS; "Ultra Small 3-axis Magnetic Sensor, with I$^2$C Interface;" Mar. 31, 2010; 8 pages.

Micronas GmbH; "HAL® 3625 Programmable Direct Angle Sensor;" Product Information; Sep. 2009; 2 pages.

Melexis MLX 90324; ""Under-the-Hood" Triaxis Rotary Position feat. SENT Protocol;" 3901090324 Data Sheet; Dec. 2008; 40 pages.

Notification of Transmittal of the International Search Report and the Written Opinion of the International Searching Authority, or the Declaration, PCT/US2012/036071, data of mailing Sep. 4, 2012, 21 pages.

Banjevic M et al., "2D CMOS Integrated Magnetometer Based on the Miniaturized Circular Vertical Hall Device", Solid-State Sensors, Actuators and Microsystems Conference, 2009. Transducers 2009. International, IEEE, Piscataway, NJ, USA. Jun. 21, 2009, pp. 877-880, XP031545769, ISBN: 978-1-4244-4190-7.

Petrie; "Circular Vertical Hall Magnetic Field Sensing Element and Method with a Plurality of Continuous Output Signals;" U.S. Appl. No. 13/035,243, filed Feb. 25, 2011; 56 pages.

Drljaca, et al.; "Nonlinear Effects in Magnetic Angular Position Sensor With Integrated Flux Concentrator;" Proc. 23rd International Conference on Microelectronics (MIEL 2002); vol. 1; NIS; Yugoslavia; May 12-15, 2002; pp. 223-226.

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications," published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.

(56) References Cited

OTHER PUBLICATIONS

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544.

Burger et al.; "New fully integrated 3-D silicon Hall sensor for precise angular-position measurements;" Sensors and Actuators, A 67; May 1998; pp. 72-76.

Dwyer; Allegro Microsystems, Inc.; "AN296061 Data Sheet: Ring Magnet Speed Sensing for Electronic Power Steering;" published Jul. 21, 2009; pp. 1-4.

Freitas et al.; "Giant magnetoresistive sensors for rotational speed control;" Jorunal of Applied Physics, vol. 85, No. 8; Apr. 15, 1999; pp. 5459-5461.

Gilbert; "Technical Advances in Hall-Effect Sensing;" Allegro Microsystems, Inc. Product Description; May 10, 2008; 7 sheets.

Häberli et al.; "Contactless Angle Measurements by CMOS Magnetic Sensor with on Chip Read-Out Circuit;" The 8$^{th}$ International Conference on Solid-State Sensors and Actuators and Eurosensors IX; Jan. 25-29, 1995; pp. 134-137.

Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 Degrees Rotary Position Sensor IC;" 2004 IEEE Proceedings of Sensors, vol. 3; Oct. 24-27, 2004; pp. 1137-1142.

Kejik et al.; "Circular Hall Transducer for Angular Position Sensing;" International Solid-State Sensors, Actuators and Microsystems Conference; Transducers; Jun. 2007; pp. 2593-2596.

Lou Law; "Angle Position Sensing with 2-Axis Hall ICs;" Sensors Magazine, vol. 20, No. 3; Mar. 2003; 7 sheets.

Masson et al.; "Multiturn and high precision through-shaft magnetic sensors;" Sensor + Text Conference; Proceedings II; May 2009; pp. 41-46.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388.

Munter; "A Low-offset Spinning-current Hall Plate;" Sensors and Actuators, vol. A21-A23; Jan. 1990; pp. 743-746.

Novotechnik Siedle Group; "How New Angular Positioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The 8$^{th}$ International Conference on Solid-State Sensors and Acutators, Physical vol. 53, Issues 1-3; May 1996; pp. 278-283.

Petoussis et al.; "A Novel Hall Effect Sensor Using Elaborate Offset Cancellation Method;" Sensors & Transducers Journal, vol. 100, Issue 1; Jan. 2009; pp. 85-91.

Popovic; "Not-plate-like Hall magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vector Probe for Contactless Angle Measurement System;" International Electron Devices Meeting; Dec. 8-11, 1996; pp. 533-536.

SENSIMA technology sa; "CVHD: a new concept of Angular Position Sensor;" Slide Presentation for Allegro Microsystems; Mar. 2009; 17 sheets.

Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20trasduttori/Data%20Sheet%20-%202SA-10.pdf; pp. 1-7.

van der Meer; et al; "CMOS quad spinning-current Hall-sensor system for compass application;" IEEE Proceedings of Sensors, vol. 3; Oct. 24-27, 2004; pp. 1434-1437.

Vogelgesang et al.; Robert Bosch GmbH; "GMR sensors in automotive application;" CS-SNS/ECS Slides Presentation; Mar. 2, 2005; 16 sheets.

Volder; "The CORDIC Trigonometric Computing Technique;" The Institute of Radio Engineers, Inc.; IRE Transactions on Electronic Computers, vol. EC, Issue 3; Sep. 1959; pp. 226-230.

Banjevic; "High Bandwidth CMOS Magnetic Sensors Based on the Miniaturized Circular Vertical Hall Device;" Sep. 2011; 153 pages.

PCT International Preliminary Report on Patentability dated Dec. 27, 2013; for PCT Pat. App. No. PCT/US2012/036071; 16 pages.

European Response to Written Opinion recieved May 29, 2014: for European Patent Application No. EP 12719886.9; 39 pages.

ARRANGEMENTS FOR SELF-TESTING A CIRCULAR VERTICAL HALL (CVH) SENSING ELEMENT AND/OR FOR SELF-TESTING A MAGNETIC FIELD SENSOR THAT USES A CIRCULAR VERTICAL HALL (CVH) SENSING ELEMENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits, and, more particularly, to an electronic circuit that can perform a self-test of a circular vertical Hall (CVH) sensing element and/or a self-test of a magnetic field sensor that uses a circular vertical Hall (CVH) sensing element.

BACKGROUND OF THE INVENTION

As is known, sensing elements are used in a variety of applications to sense characteristics of an environment. Sensing elements include, but are not limited to, pressure sensing elements, temperature sensing elements, light sensing elements, acoustic sensing elements, and magnetic field sensing elements.

A magnetic field sensor can include one or more magnetic field sensing elements and also other electronics.

Magnetic field sensors can be used in a variety of applications. In one application, a magnetic field sensor can be used to detect a direction of a magnetic field. In another application, a magnetic field sensor can be used to sense an electrical current. One type of current sensor uses a Hall effect magnetic field sensing element in proximity to a current-carrying conductor.

Planar Hall elements and vertical Hall elements are known types of magnetic field sensing elements that can be used in magnetic field sensors. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical magnetic field sensing elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (and optionally a strength) of a magnetic field in a plane of the substrate.

Conventionally, all of the output signals from the plurality of vertical Hall elements within the CVH sensing element are needed in order to determine a direction of a magnetic field. Also conventionally, output signals from the vertical Hall elements of a CVH sensing element are generated sequentially.

Various parameters characterize the performance of sensing elements (and sensors that use sensing elements) in general, and magnetic field sensing elements (and magnetic field sensors) in particular. Taking a magnetic field sensing element as an example, these parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field. Other types of sensing elements can also have an offset of a respective output signal that is not representative of a zero sensed characteristic when the sensing element experiences the zero sensed characteristic.

Another parameter that can characterize the performance of a magnetic field sensing element is the speed with which output signals from the magnetic field sensing elements can be sampled.

The CVH sensing element is a moderately complex structure formed upon a substrate. It would be desirable to be able to self-test the CVH sensing element. One form of self-test can identify if the plurality of output signals from the CVH sensing element operating in normal operation are correct when the CVH sensing element is in the presence of a magnetic field.

This type of self-test could be performed during manufacturing. However, when in use in the field, the direction and strength of an external magnetic field used to test the CVH sensing element are difficult to control, and thus, the self-test using the external magnetic field would be of limited use.

The same limitations apply to a self-test of a magnetic field sensor that uses the CVH sensing element.

Thus, it would be desirable to have a form of self-test of a CVH sensing element and/or a self-test of a magnetic field sensor that uses a CVH sensing element, wherein the self-test does not depend upon a magnetic field.

SUMMARY OF THE INVENTION

The present invention provides a form of self-test of a CVH sensing element and/or a self-test of a magnetic field sensor that uses a CVH sensing element, wherein the self-test does not depend upon a magnetic field.

In accordance with one aspect of the present invention, a magnetic field sensor includes a circular vertical Hall (CVH) sensing element. The CVH sensing element includes a plurality of vertical Hall element contacts arranged over a common implant region in a substrate, and a plurality of vertical Hall elements. Each vertical Hall element comprised of a respective group of vertical Hall element contacts selected from among the plurality of vertical Hall element contacts. The magnetic field sensor further includes a switching network comprising a plurality of connection nodes. A portion of the plurality of connection nodes is coupled to the plurality of Hall element contacts. The magnetic field sensor further includes a plurality of drive circuits. Another portion of the plurality of connection nodes is coupled to the plurality of drive circuits. The switching network is operable to couple the plurality of drive circuits to selected vertical Hall element contacts of at least a first one of the plurality of vertical Hall elements, and operable to switch into a normal mode configuration and into a first self-test mode configuration associated with the at least first one of the plurality of vertical Hall elements. When in the normal mode configuration, the at least first one of the plurality of vertical Hall elements provides a respective normal mode voltage between vertical Hall element contacts of the at least first one of the plurality of vertical Hall elements. The normal mode voltage is responsive to a magnetic field. When in the first self-test mode configuration, the at least first one of the plurality of vertical Hall elements provides a respective first self-test voltage between a respective selected pair of vertical Hall element contacts of the at least first one of the plurality of vertical Hall elements. The first self-test voltage is related to a resistance between vertical Hall element contacts of the at least first one of the plurality of vertical Hall elements, respectively.

In accordance with another aspect of the present invention, a method of self-testing a magnetic field sensor having a circular vertical Hall (CVH) sensing element, where the CVH sensing element includes a plurality of vertical Hall element contacts arranged over a common implant region in a substrate and comprising a plurality of vertical Hall elements, each vertical Hall element including a respective group of vertical Hall element contacts selected from among the plurality of vertical Hall element contacts, the method includes coupling a plurality of drive circuits to selected vertical Hall element contacts of at least a first one of the plurality of vertical Hall elements. The coupling the plurality of drive circuits includes switching the couplings at a first selected time into a normal mode configuration associated with the at least first one of the plurality of vertical Hall elements, and switching the couplings at a second different selected time into a first self-test mode configuration associated with the at least first one of the plurality of vertical Hall elements. When in the normal mode configuration, the at least first one of the plurality of vertical Hall elements provides a respective normal mode voltage between vertical Hall element contacts of the at least first one of the plurality of vertical Hall elements. The normal mode voltage is responsive to a magnetic field. When in the first self-test mode configuration, the at least first one of the plurality of vertical Hall elements provides a respective first self-test voltage between a respective selected pair of vertical Hall element contacts of the at least first one of the plurality of vertical Hall elements. The first self-test voltage is related to a resistance between vertical Hall element contacts of the at least first one of the plurality of vertical Hall elements, respectively.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
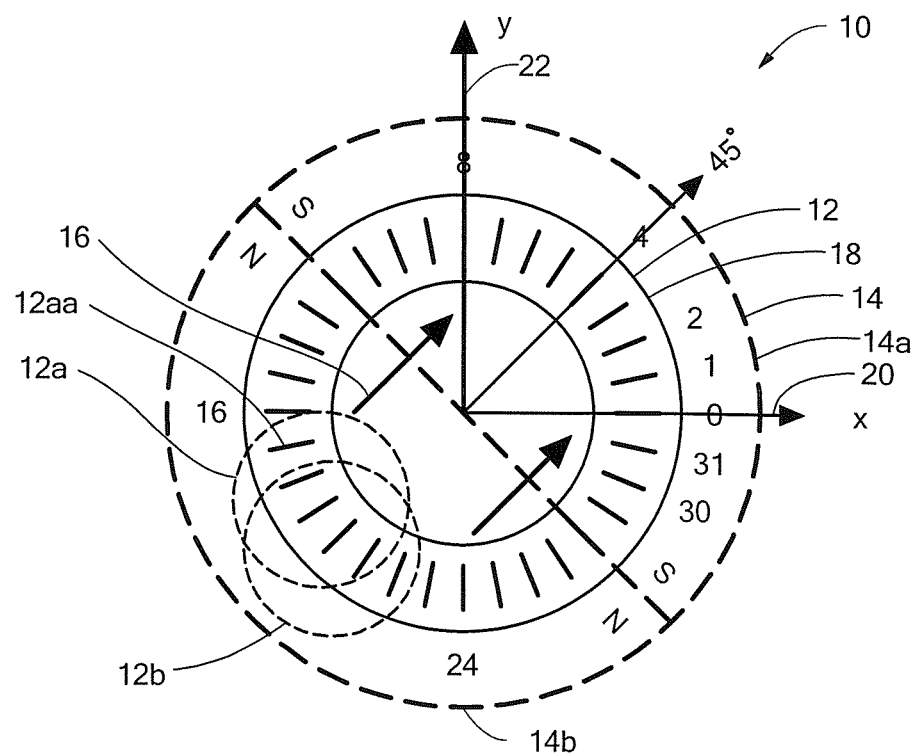
FIG. 1 is a pictorial showing a circular vertical Hall (CVH) sensing element having a plurality of vertical Hall elements arranged in a circle over a common implant region and a two pole magnet disposed close to the CVH sensing element.

Before describing the present invention, some introductory concepts and terminology are explained. As used herein, the term "sensing element" is used to describe a variety of types of electronic elements that can sense a characteristic of the environment. For example, sensing elements include, but are not limited to, pressure sensing elements, temperature sensing elements, motion sensing elements, light sensing elements, acoustic sensing elements, and magnetic field sensing elements.

As used herein, the term "sensor" is used to describe a circuit or assembly that includes a sensing element and other components. In particular, as used herein, the term "magnetic field sensor" is used to describe a circuit or assembly that includes a magnetic field sensing element and electronics coupled to the magnetic field sensing element.

As used herein, the term "measuring device" is used to describe either a sensing element or a sensor. For example, a magnetic field measuring device can be either a magnetic field sensing element or a magnetic field sensor. A measuring device is any device that can measure a parameter of the environment.

As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, a circular Hall element, and a circular vertical Hall (CVH) sensing element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Referring to FIG. 1, a circular vertical Hall (CVH) sensing element 12 includes a circular implant region 18 having a plurality of vertical Hall elements disposed thereon, of which a vertical Hall element 12a is but one example. Each vertical Hall element has a plurality of Hall element contacts (e.g., four or five contacts), of which a vertical Hall element contact 12aa is but one example.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the exemplary CVH 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a south side 14a and a north side 14b can be disposed over the CVH 12. The circular magnet 14 tends to generate a magnetic field 16 having a direction from the north side 14b to the south side 14a, here shown to be pointed to a direction of about forty-five degrees relative to x-axis 20. Other magnets having other shapes and configurations are possible.

In some applications, the circular magnet 14 is mechanically coupled to a rotating object (a target object), for example, an automobile crank shaft or an automobile camshaft, and is subject to rotation relative to the CVH sensing element 12. With this arrangement, the CVH sensing element 12 in combination with an electronic circuit described below can generate a signal related to the angle of rotation of the magnet 14.

Figure 2:
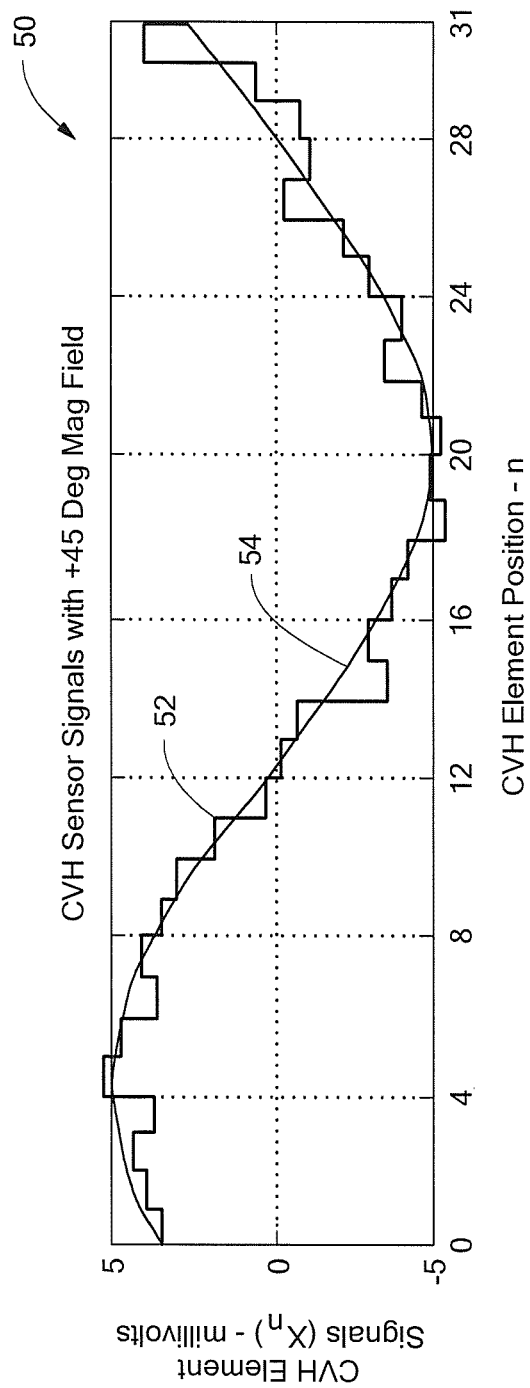
FIG. 2 is a graph showing an output signal as may be generated by the CVH sensing element of FIG. 1.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element.

The graph 50 includes a signal 52 representative of output signal levels from the plurality of vertical Hall elements of the CVH taken sequentially with the magnetic field 16 of FIG. 1 stationary and pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 2, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field 16. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field 16.

A sine wave 54 is provided to more clearly show the ideal behavior of the signal 52. The signal 52 has variations due to vertical Hall element offsets, which tend to somewhat randomly cause element output signals to be too high or too low relative to the sine wave 54, in accordance with offset errors for each element. The offset signal errors are undesirable. In some embodiments, the offset errors can be reduced by "chopping" each vertical Hall element. Chopping will be understood to be a process by which vertical Hall element contacts of each vertical Hall element are driven in different configurations and signals are received from different ones of the vertical Hall element contacts of each vertical Hall element to generate a plurality of output signals from each vertical Hall element. The plurality of signals can be arithmetically processed (e.g., summed or otherwise averaged) resulting in a signal with less offset. Chopping is described more fully below in conjunction with FIGS. 4-4C.

Full operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

As will be understood from PCT Patent Application No. PCT/EP2008/056517, groups of contacts of each vertical Hall element can be used in a multiplexed or chopped arrangement to generate chopped output signals from each vertical Hall element. Thereafter, a new group of adjacent vertical Hall element contacts can be selected (i.e., a new vertical Hall element), which can be offset by one or more elements from the prior group. The new group can be used in the multiplexed or chopped arrangement to generate another chopped output signal from the next group, and so on.

Each step of the signal 52 can be representative of a chopped output signal from one respective group of vertical Hall element contacts, i.e., from one respective vertical Hall element. However, in other embodiments, no chopping is performed and each step of the signal 52 is representative of an unchopped output signal from one respective group of vertical Hall element contacts, i.e., from one respective vertical Hall element. Thus, the graph 52 is representative of a CVH output signal with or without the above-described grouping and chopping of vertical Hall elements.

It will be understood that, using techniques described above in PCT Patent Application No. PCT/EP2008/056517, a phase of the signal 52 (e.g., a phase of the signal 54) can be found and can be used to identify the pointing direction of the magnetic field 16 of FIG. 1 relative to the CVH sensing element 12.

Figure 3:
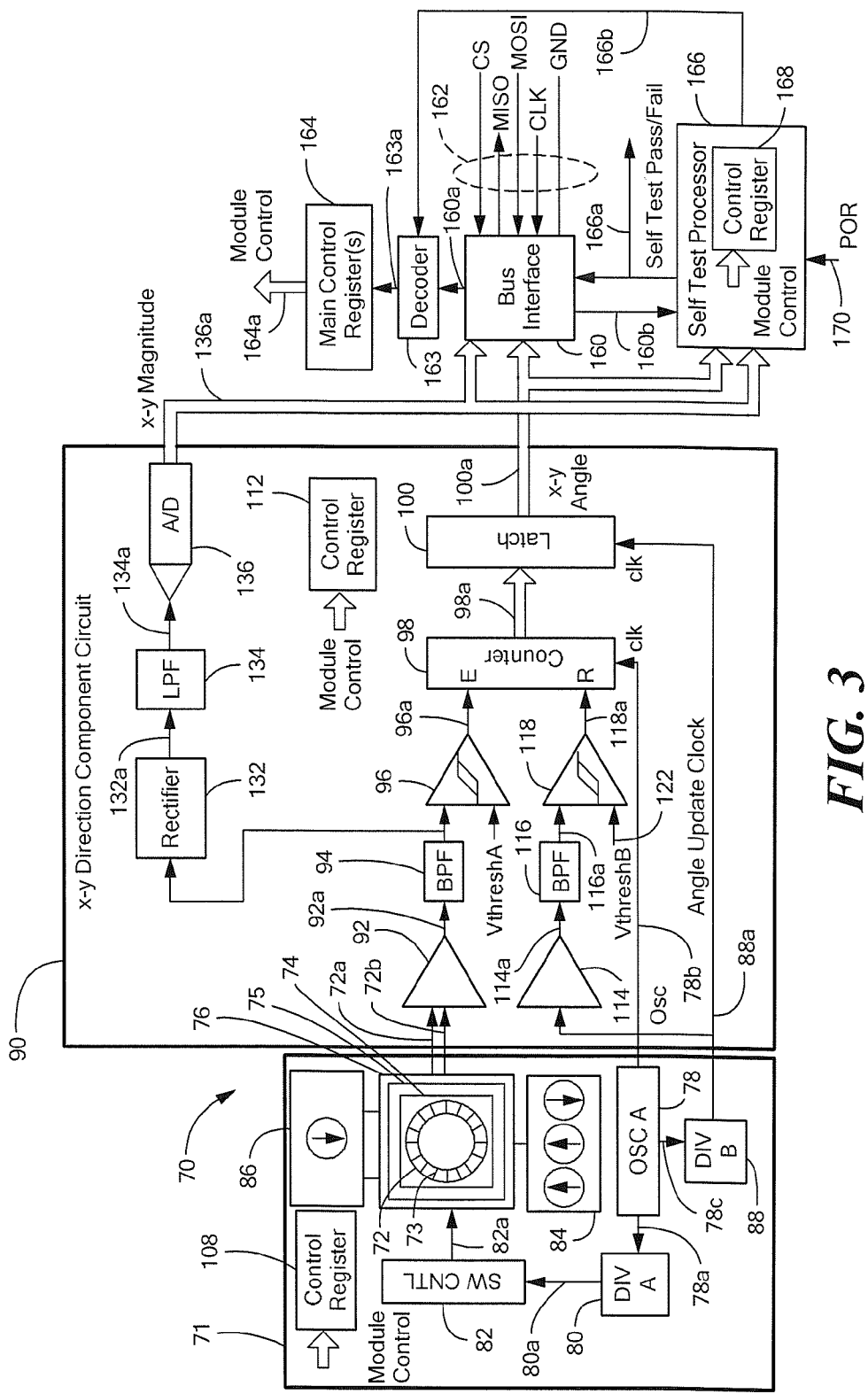
FIG. 3 is a block diagram of a magnetic field sensor having a CVH sensing element, having a switching circuit operable to couple the CVH sensing element into a normal mode configuration and into a least one of a first or a second self-test mode configuration, and also having a self-test processor operable to control a self-test of the magnetic field sensor.

Referring now to FIG. 3 a magnetic field sensor 70 includes a sensing portion 71. The sensing portion 71 can include a CVH sensing element 72 having a plurality of CVH sensing element contacts, e.g., a CVH sensing element contact 73. In some embodiments there are thirty-two vertical Hall elements in the CVH sensing element 72 and a corresponding thirty-two CVH sensing element contacts. In other embodiments there are sixty-four vertical Hall elements in the CVH sensing element 72 and a corresponding sixty-four CVH sensing element contacts.

A magnet (not shown) can be disposed proximate to the CVH sensing element 72, and can be coupled to a target object (not shown). The magnet can be the same as or similar to the magnet 14 of FIG. 1

As described above, the CVH sensing element 72 can have a plurality of vertical Hall elements, each vertical Hall element comprising a group of vertical Hall element contacts (e.g., five vertical Hall element contacts), of which the vertical Hall element contact 73 is but one example.

In some embodiments, a switching circuit 74 can provide sequential CVH differential output signals 72a, 72b from the CVH sensing element 72.

The CVH differential output signal 72a, 72b is comprised of sequential output signals taken one-at-a-time around the CVH sensing element 72, wherein each output signal is generated on a separate signal path and switched by the switching circuit 74 into the path of the differential output signal 72a, 72b. The signal 52 of FIG. 2 can be representative of the differential signal 72a, 72b. Therefore, the CVH differential output signal 72a, 72b can be represented as a switched set of CVH output signals $x_n=x_0$ to $x_{N-1}$, taken one at a time, where n is equal to a vertical Hall element position (i.e., a position of a group of vertical Hall element contacts that form a vertical Hall element) in the CVH sensing element 72, and where there are N such positions.

In one particular embodiment, the number of vertical Hall elements (each comprising a group of vertical Hall element contacts) in the CVH sensing element 72 is equal to the total number of sensing element positions, N. In other words, the CVH differential output signal 72a, 72b can be comprised of sequential output signals, wherein the CVH differential output signal 72a, 72b is associated with respective ones of the vertical Hall elements in the CVH sensing element 72 as the switching circuit 74 steps around the vertical Hall elements of the CVH sensing element 72 by increments of one, and N equals the number of vertical Hall elements in the CVH sensing element 72. However, in other embodiments, the increments can be by greater than one vertical Hall element, in which case N is less than the number of vertical Hall elements in the CVH sensing element 72.

In one particular embodiment, the CVH sensing element 72 has thirty-two vertical Hall elements, i.e., N=32, and each step is a step of one vertical Hall element contact position (i.e., one vertical Hall element position). In other embodiments, there can be more than thirty-two or fewer than thirty-two vertical Hall elements in the CVH sensing element 72, for example sixty-four vertical Hall elements. Also, the increments of vertical Hall element positions, n, can be greater than one vertical Hall element contact.

In some embodiments, another switching circuit 75 can provide the above-described "chopping" of groups of the vertical Hall elements within the CVH sensing element 72. Chopping will be understood to be an arrangement in which a group of vertical Hall element contacts, for example, five vertical Hall element contacts that form one vertical Hall element, are driven with current sources 86 in a plurality of different connection configurations, and signals are received from the group of vertical Hall element contacts in corresponding different configurations to generate the CVH differential output signal 72a, 72b. Thus, in accordance with each vertical Hall element position, n, there can be a plurality of sequential output signals during the chopping, and then the group increments to a new group, for example, by an increment of one vertical Hall element contact.

The sensing portion 71 can also include a current source 86 configured to drive the CVH sensing element 72 when the CVH sensing element 72 is coupled in a so-called "normal mode" configuration. When in the normal mode configuration, the CVH sensing element 72 can be chopped or unchopped.

The sensing portion 71 can also include current sources 84 configured to drive the CVH sensing element 72 when the CVH sensing element 72 is coupled in at least one so-called "self-test mode" configuration. The normal mode configuration is described more fully below in conjunction with FIGS. 4-4C. Self-test mode configurations are described more fully below in conjunction with FIGS. 5-6A.

While current sources 84, 86 are shown, in other embodiments, the current sources 84, 86 can be replaced by voltage sources.

In order to achieve the normal mode configuration and the one or more self-test mode configurations, the sensing portion 71 can also include another switching circuit 76.

From discussion below in conjunction with FIGS. 4-6A, it will become apparent that the functions of the switching circuits 74, 75, 76 are to provide different couplings of the drive sources 86, 84 to the vertical Hall elements of the CVH sensing element 72 and to provide couplings to different ones of the vertical Hall elements contacts of the vertical Hall elements of the CVH sensing element 72 to generate different differential output signals 72a, 72b.

The magnetic field sensor 70 includes an oscillator 78 that provides clock signals 78a, 78b, 78c, which can have the same or different frequencies. A divider 80 is coupled to receive the clock signal 78a and configured to generate a divided clock signal 80a. A switch control circuit 82 is coupled to receive the divided clock signal 80a and configured to generate switch control signals 82a, which are received by the switching circuits 74, 75, 76 to control the sequencing around the CVH sensing element 72, optionally, to control the chopping of groups of vertical Hall elements within the CVH sensing element 72 in ways described above, and to control the normal mode configuration and the one or more self-test mode configurations of the CVH sensing element 72.

The magnetic field sensor 70 can include a divider 88 coupled to receive the clock signal 78c and configured to generate a divided clock signal 88a, also referred to herein as an "angle update clock" signal.

One or more control registers 108 can control one or more characteristics of the sensing circuit 71. For example, the control register 108 can control divide ratios of the dividers 80, 88, or a clock frequency of the oscillator 88.

The magnetic field sensor 70 also includes an x-y direction component circuit 90. The x-y direction component circuit 90 can include an amplifier 92 coupled to receive the CVH differential output signals 72a, 72b. The amplifier 92 is configured to generate an amplified signal 92a. A bandpass filter 94 is coupled to receive the amplified signal 92a and configured to generate a filtered signal 94a. A comparator 96, with or without hysteresis, is configured to receive the filtered signal 94a. The comparator 96 is also coupled to receive a threshold signal 120. The comparator 96 is configured to generate a thresholded signal 96a generated by comparison of the filtered signal 94a with the threshold signal 120.

The x-y direction component circuit 90 also includes an amplifier 114 coupled to receive the divided clock signal 88a. The amplifier 114 is configured to generate an amplified signal 114a. A bandpass filter 116 is coupled to receive the amplified signal 114a and configured to generate a filtered signal 116a. A comparator 118, with or without hysteresis, is coupled to receive the filtered signal 116a. The comparator 118 is also coupled to receive a threshold signal 122. The comparator 118 is configured to generate a thresholded signal 118a by comparison of the filtered signal 116a with the threshold signal 122.

The bandpass filters 94, 116 can have center frequencies equal to 1/T, where T is the time that it takes to sample all of the vertical Hall elements within the CVH sensing element 72.

It should be understood that the amplifier 114, the bandpass filter 116, and the comparator 118 provide a delay of the divided clock signal 88a in order to match a delay of the circuit channel comprised of the amplifier 92, the bandpass filter 94, and the comparator 96. The matched delays provide phase matching, in particular, during temperature excursions of the magnetic field sensor 70.

A counter 98 can be coupled to receive the thresholded signal 96a at an enable input, to receive the clock signal 78b at a clock input, and to receive the thresholded signal 118a at a reset input.

The counter 98 is configured to generate a phase signal 98a having a count representative of a phase difference between the thresholded signal 96a and the thresholded signal 118a.

The phase shift signal 98a is received by a latch 100 that is latched upon an edge of the divided clock signal 88a. The latch 100 is configured to generate a latched signal 100a, also referred to herein as an "x-y direction signal."

It will be apparent that the latched signal 100a is a multi-bit digital signal that has a value representative of a direction of an angle of the magnetic field experience by the CVH sensing element 72, and thus, an angle of the magnet and target object.

In some embodiments, the clock signals 78a, 78b, 78c each have a frequency of about 30 MHz, the divided clock signal 80a has a frequency of about 8 MHz, and the angle update clock signal 88a has a frequency of about 30 kHz. However in other embodiments, the initial frequencies can be higher or lower than these frequencies. In some embodiments, the dividers 80, 88 are programmable by a user in ways described more fully below to generate different frequencies.

The x-y direction component circuit 90 can also include an amplitude detecting path comprised of a rectifier 132 coupled to receive the filtered signal 94a and configured to generated a rectified signal 132a, a low pass filter coupled to receive the rectified signal 132a and configured to generate a filtered signal 134a, and an analog-to-digital converter 136 coupled to receive the filtered signal 134a and configure to generate an x-y magnitude signal 136a. It will be understood that both the filtered signal 134a and the x-y magnitude signal 136a are indicative of a magnitude of the filtered signal 92a. Thus, the x-y magnitude signal 136a can be used to identify a proper magnitude (or amplitude) of signals originating from the CVH sensing element 72 in ways more fully described below.

The x-y direction component circuit 90 can also include one or more control registers 112 used to set one or more characteristics of the x-y direction component circuit. For example, values in the control register 112 can be used to set center frequencies and/or bandwidths of the band pass filters 94, 116, and gains of the amplifiers 92, 114.

The magnetic field sensor 90 can also include a bus interface circuit 160. The bus interface circuit 160 can be coupled to receive the x-y angle signal 100a and the x-y magnitude signal 136a. These signals can be communicated to a user or to another processor (not shown) via a bus structure 162.

It will be understood here, that the term "bus" is used to describe either a serial or parallel bus having one conductor or a plurality of conductors.

The bus interface circuit 160 is coupled with the bus interface structure 162 to communicate with a use or with another processor (not shown) with a standard format, for example, an SPI format, a SENT format, or an I2C format. The bus interface structure 162 can communicate the x-y angle signal 100a and the x-y magnitude signal 136a.

The bus interface circuit 160 can also receive various control data upon the bus interface structure 162. The bus interface circuit 160 can communicate the control data 160a to a decoder circuit 163, which can communicate decoded information 163a to main control registers 164, which can store the decoded control data 163a. The main control registers 164 can communicate a module control signal 164a to the control registers 108, 112, 168 within the various modules described above, to affect characteristics of the modules.

The magnetic field sensor 70 can also include a self-test processor 166 coupled to receive the x-y magnitude signal 136a and the x-y angle signal 100a. In response to one or more of the x-y magnitude signal 136a or the x-y angle signal 100a, the self-test processor 166 can generate a self-test pass fail signal 166a indicative of a properly functioning magnetic field sensor or a malfunctioning magnetic field sensor.

In some embodiments, the self-test signal 166a is a two state signal having a first state indicative of a passing self-test and a second different state indicative of a failing self-test. In other embodiments, the self-test signal 166a is a multi-bit signal that can represent details about the failing or passing self-test. For example, in some embodiments, the self-test signal 166a can indicate a failure of a magnitude of the x-y magnitude signal 136a being too high or being too low, i.e., outside of predetermined amplitude limits. In some embodiments, the self-test signal 166a can indicate a failure of the x-y angle signal 100a being indicative of an angle of a magnetic field that is too high or too low, i.e., outside of predetermined angle limits. In still other embodiments, the self-test signal 166a can be indicative of a malfunction the CVH sensing element 72, and can be indicative of specific ones of the vertical Hall elements within the CVH sensing element 72 that are malfunctioning. Other specific malfunction indications are also possible.

The self-test processor 166 can include control registers 168 that can set one or more characteristics of the functions of the self-test processor 166.

The bus interface circuit 160 can be coupled to receive the self-test signal 166a and can pass a signal representative or the self-test signal 166a through the bus interface structure 162 to a user or to another processor (not shown). The self-test processor 166 can also receive a control signal 160b from the bus interface circuit 160, which can be provided by a user or by another processor. The control signal 160b can, for example, turn the self-test function of the self-test processor 166 on or off, or can otherwise control parameters of the self-test function, for example, a duty cycle or timing of the self-test function.

The self-test processor 166 is also configured to generate a self-test control signal 166b received by the decoder circuit 163. The self-test control signal can be decoded by the decoder circuit 163 along with other control signals provided by the bus interface circuit 160. In this way, a combination of the other control signals and the self-test control signal 166b can program main control registers 164, which, in turn, set one or more the control registers 108, 112, 168.

Figure 4:
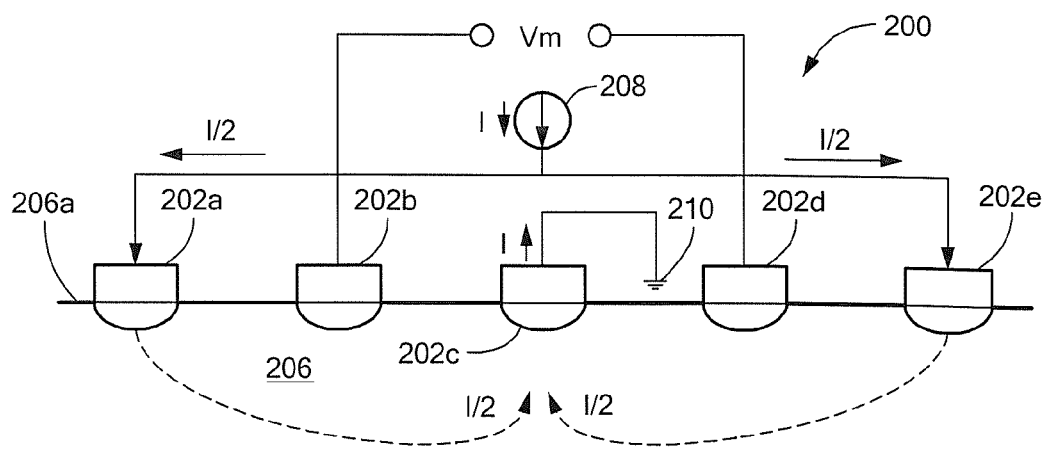
FIGS. 4-4C are block diagram showing a vertical Hall element of the CVH sensing element of FIG. 3 when coupled into four chopping phases, each phase associated with the normal mode of operation of the magnetic field sensor of FIG. 3.
Figure 4A:
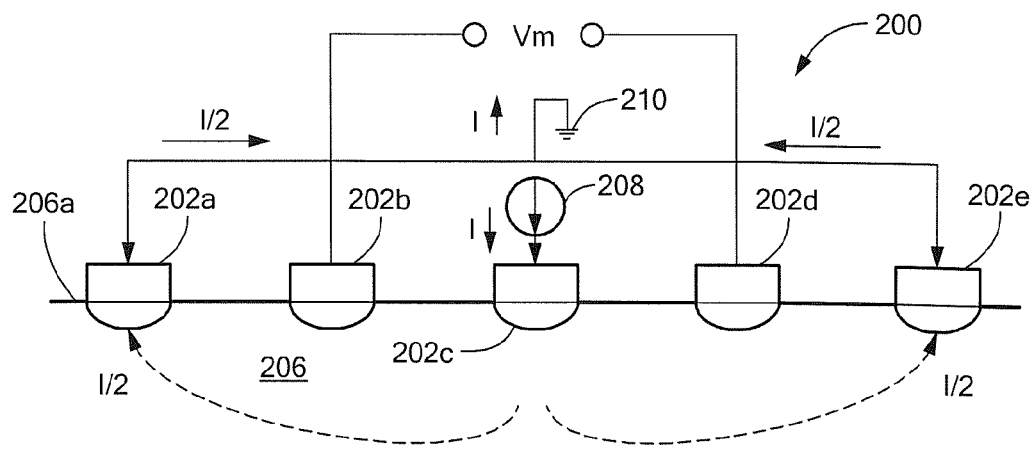
Figure 4B:
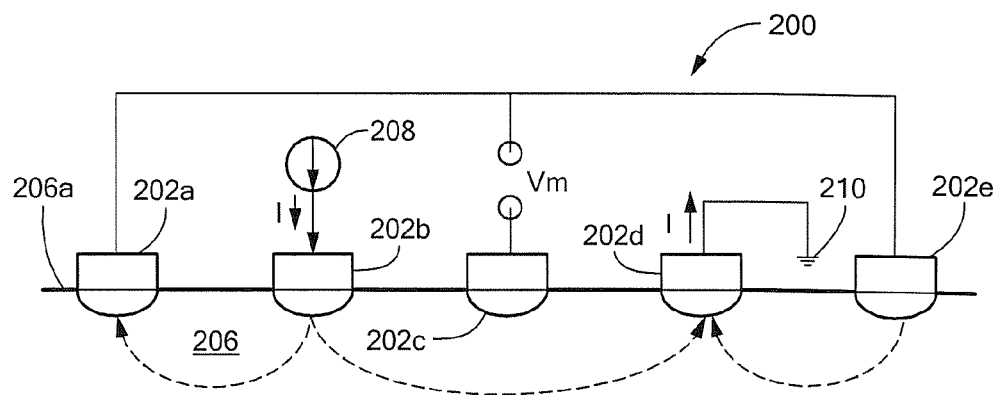
Figure 4C:
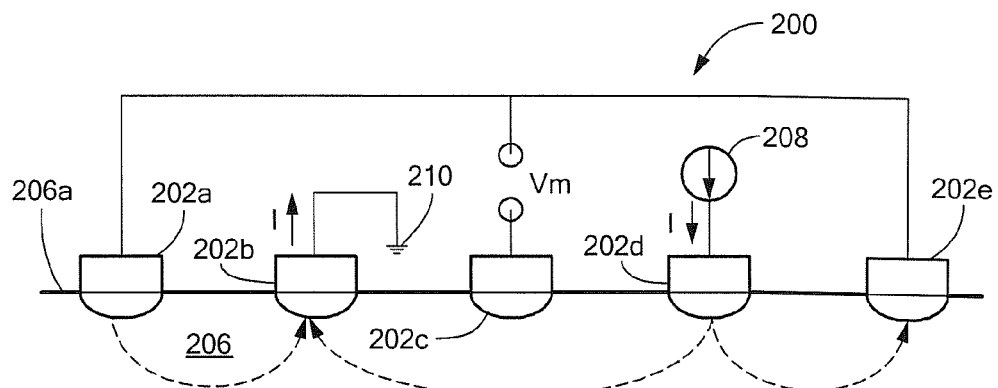

Referring now to FIGS. 4-4C, chopping of the CVH sensing element 72 of FIG. 3 by way of the switching circuit 75 is described. Reference is made to chopping of one of the vertical Hall elements within the CVH sensing element. However, it should be understood that the one vertical Hall element is chopped by way of the switching circuit 75, and then a next vertical Hall element is selected by the switching circuit 74 for chopping by the switching circuit 75.

Chopping is performed in the above-mentioned normal mode configuration. However, if no chopping is used, any one of the states of FIGS. 4-4C can be static and the normal mode configuration can similarly be static.

Referring now to FIG. 4, a vertical Hall element 200 of the CVH sensing element 72 of FIG. 3 is comprised of five vertical Hall element contacts, namely, first, second, third, fourth, and fifth vertical Hall element contacts, 202a, 202b, 202c, 202d, 202e, respectively. In a first chopping phase, a current source 208, which can be the same as or similar to the current source 86 of FIG. 3 can be coupled to the first and fifth vertical Hall element contacts 202a, 202e, respectively, which are coupled together, and can provide a total current of I, half of the current, I/2, flowing to the first vertical a Hall element contact 202a and half of the current, I/2, flowing to the fifth vertical Hall element contact 202e. The third vertical Hall element contact 202c is coupled to a voltage reference 210, for example, ground. Currents from the current source 208 flow from the first and fifth vertical Hall element contacts 202a, 202e, respectively, through a substrate 206 of the CVH sensing element 200 to the third vertical Hall element contact 202c, as represented by dashed lines.

A signal, Vm, responsive to an external magnetic field, results between the second and fourth vertical Hall element contacts 202b, 202d, respectively.

Referring now to FIG. 4A, in which like elements of FIG. 4 are shown having like reference designations, in a second chopping phase of the same vertical Hall element 200 (same five vertical Hall element contacts) of the CVH sensing element 72, couplings are changed by the switching circuit 75. In the second phase, the current source 208 is coupled to the third vertical Hall element contact 202c, and the first and fifth vertical Hal element contacts 202a, 202e, respectively, are coupled together and to the reference voltage 210. Thus, the currents flow through the substrate 206 in opposite directions from those shown in FIG. 4.

As in FIG. 4, a signal, Vm, responsive to an external magnetic field, results between the second and fourth vertical Hall element contacts, 202b, 202d, respectively. The signal, Vm, of FIG. 4A is like the signal, Vm, of FIG. 4. However, the offset voltage within the signals can be different.

Referring now to FIG. 4B, in which like elements of FIGS. 4 and 4A are shown having like reference designations, in a third chopping phase upon the same vertical Hall element 200 (same five vertical Hall element contacts) of the CVH sensing element 72, couplings are again changed by the switching circuit 75. In the third phase, the current source 208 is coupled to the second vertical Hall element contact 202b, and the fourth vertical Hall element contact 202d is coupled to the reference voltage 210. Thus, a current flows from the second vertical Hall element contact 202b through the substrate 206 to the fourth vertical Hall element contact 202d.

The first and fifth vertical Hall element contacts 202a, 202e, respectively, are coupled together. Some current also flows from the second vertical Hall element contact 202b through the substrate 206 to the first vertical Hall element contact 202a and through the mutual coupling to the fifth vertical Hall element contact 202e. Some current also flows from the fifth vertical Hall element contact 202e through the substrate 206 to the fourth vertical Hall element contact 202d.

A signal, Vm, responsive to an external magnetic field, results between the first vertical Hall element contact 202a first (and the fifth vertical hall element contact 202e) and the third vertical Hall element contact 202c. The signal, Vm, of FIG. 4B is like the signal, Vm, of FIGS. 4 and 4A. However, the offset voltage within the signal can be different.

Referring now to FIG. 4C, in which like elements of FIGS. 4-4B are shown having like reference designations, in a fourth chopping phase upon the same vertical Hall element 200 (same five vertical Hall element contacts) of the CVH sensing element 72, couplings are again changed by the switching circuit 75. In the fourth phase, the current is reversed from that shown in FIG. 4B. The current source 208 is coupled to the fourth vertical Hall element contact 202d, and the second vertical Hall element contact 202b is coupled to the reference voltage 210. Thus, a current flows from the fourth vertical Hall element contact 202d through the substrate 206 to the second vertical Hall element contact 202b.

The first and fifth vertical Hall element contacts 202a, 202e, respectively, are coupled together. Some current also flows from the fourth vertical Hall element contact 202d through the substrate 206 to the fifth vertical Hall element contact 202e, through the mutual coupling to the first vertical Hall element contact 202a. Some current also flows from the first vertical Hall element contact 202a through the substrate 206 to the second vertical Hall element contact 202b.

A signal, Vm, responsive to an external magnetic field, results between the first vertical Hall element contact 202a (and the fifth vertical Hall element contact 202e) and the third vertical Hall element contact 202c. The signal, Vm, of FIG. 4C is like the signal, Vm, of FIGS. 4-4B. However, the offset voltage within the signal can be different.

The signals, Vm, provided by the four phases of chopping of FIGS. 4-4C can be summed or otherwise averaged, resulting in a reduction of the offset voltage.

The signals, Vm, provided by the four phases of chopping of FIGS. 4-4C are responsive to an external magnetic field.

As described above, after generating the four chopping phases on any one vertical Hall element within the CVH sensing element 72, by sequencing operation of the switching circuit 74 of FIG. 3, the arrangements of FIGS. 4-4C can move to a next vertical Hall element, e.g., five vertical Hall element contacts offset by one vertical Hall element contact from those shown in FIGS. 4-4C, and the chopping into four phases can be performed on the new vertical Hall element by operation of the switching circuit 75 of FIG. 3.

However, as described above, the normal mode configuration may not use chopping, in which case, when in the normal mode configuration, any one of the phases of FIGS. 4-4C can be used.

Figure 5:
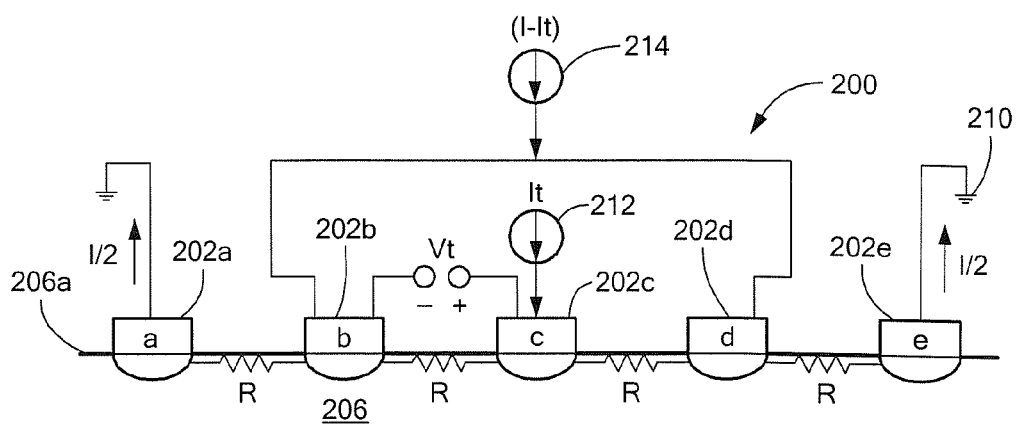
FIG. 5 is a block diagram showing the vertical Hall element of FIGS. 4-4C of the CVH sensing element of FIG. 3 when coupled in a first self-test mode configuration.

Referring now to FIG. 5, in which like elements of FIGS. 4-4D are shown having like reference designations, the same five vertical Hall element contacts of one of the vertical Hall elements 200 of the CVH sensing element 72 of FIG. 3 are again shown, but now coupled into a first self-test mode configuration by operation of the switching circuit 76 of FIG. 3.

Current sources 212, 214 can be the same as or similar to two of the current sources 84 of FIG. 3. The current source 214, which has a current value of I–It, is coupled to the second and fourth vertical Hall element contacts 202b, 202d, which are coupled together. The current source 212, which has a current value of It, is coupled to the third vertical hall element contact 202c. The reference voltage 210 is coupled to the first and fifth vertical Hall element contacts 202a, 202e, respectively.

A signal, Vt, (test voltage) results between the second vertical Hall element contact 202b (and the fourth vertical Hall element contact 202d) and the third vertical Hall element contact 202c. The signal, Vt, has little or no response to an external magnetic field.

Resistors are shown between each adjacent pair of vertical Hall element contacts. The resistors correspond to bulk resistance of the substrate 206.

The vertical Hall element contacts are also labeled a-e to add clarity to a schematic representation shown below in FIG. 5A.

Figure 5A:
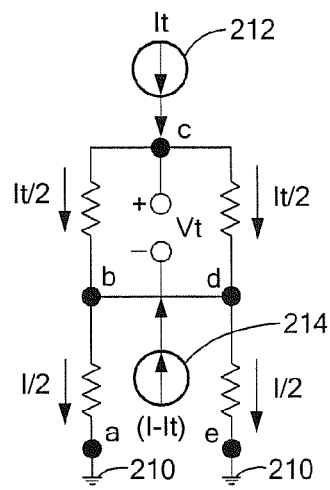
FIG. 5A is a schematic diagram showing an equivalent circuit of the vertical Hall element of FIG. 5 when coupled in the first self-test mode configuration.

Referring now to FIG. 5A, a circuit diagram includes the five nodes a-e of FIG. 5, the four resistors of FIG. 5, and the two current sources 212, 214 of FIG. 5. As described above in conjunction with FIG. 5, the signal, Vt, (test voltage) results between the second vertical Hall element contact 202b (and the fourth vertical Hall element contact 202d) and the third vertical Hall element contact 202c. The second vertical Hall element contact 202b corresponds to the node b. The third vertical Hall element contact 202c corresponds to the node c.

The voltage, Vt, is R×It/2, where R is a value of any one of the resistors.

Figure 6:
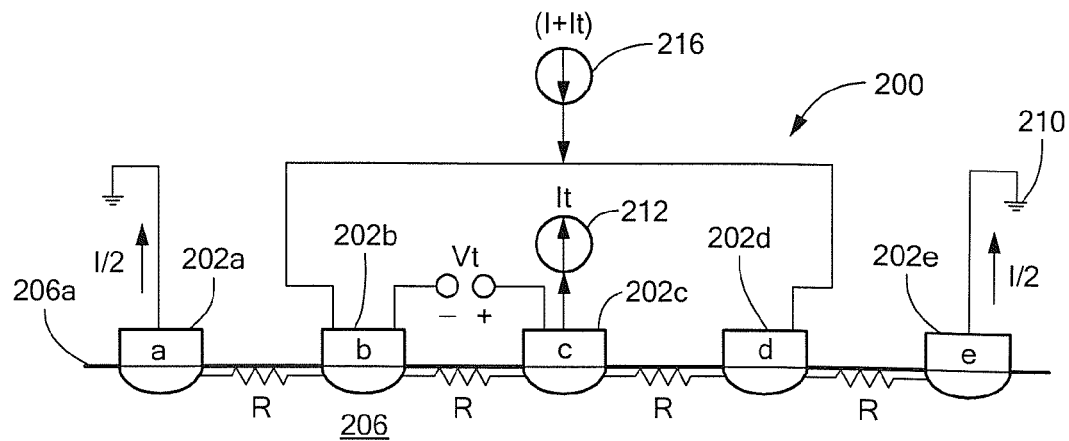
FIG. 6 is a block diagram showing the vertical Hall element of FIGS. 4-4C of the CVH sensing element of FIG. 3 when coupled in a second self-test mode configuration.

Referring now to FIG. 6, in which like elements of FIGS. 4-4D and 5 are shown having like reference designations, the same five vertical Hall element contacts of one of the vertical Hall elements 200 of the CVH sensing element 72 of FIG. 3 are again shown, but now coupled into a second self-test mode configuration by operation of the switching circuit 76 of FIG. 3.

The current source 212 and a current source 216 can be the same as or similar to two of the current sources 84 of FIG. 3. The current source 216, which has a current value of I+It, is coupled to the second and fourth vertical Hall element contacts 202b, 202d, which are coupled together. The current source 212, but reversed in direction from that of FIG. 5, which has a current value of It, is coupled as a current sink to the third vertical Hall element contact 202c.

The reference voltage 210 is coupled to the first and fifth vertical Hall element contacts 202a, 202e, respectively.

A signal, Vt, (test voltage) results between the second vertical Hall element contact 202b (and fourth vertical hall element contact 202d) and the third vertical Hall element contact 202c. The signal, Vt, is has little or no response to an external magnetic field.

Resistors are shown again between each adjacent pair of vertical Hall element contacts. The resistors correspond to bulk resistance of the substrate 206.

The voltage, Vt, is –(R×It/2), where R is a value of any one of the resistors.

In operation, when in the self-test mode, by operating half of the vertical Hall elements of the CVH sensing element 72 of FIG. 3 in the first self-test mode configuration of FIG. 5 and by operating the other half of the vertical Hall elements of the CVH sensing element 72 of FIG. 3 in the second self-test mode configuration of FIG. 6, it is possible to generate the differential output signals 72a, 72b of FIG. 3 representative of a square wave having a phase in accordance to positions of the two halves of the vertical Hall elements. The square wave, for example, can have a frequency and a phase comparable to a frequency and a phase of the signal 52 of FIG. 2.

The particular coupling arrangements shown in FIGS. 5 and 6 have a particular advantage over other self-test coupling arrangements. Namely, by having the end vertical Hall element contacts, e.g., the first and fifth vertical Hall element contacts 202a, 202e, coupled to the reference voltage 210, any vertical Hall element is effectively isolated from any other vertical Hall element within the CVH sensing element when in the first or second self-test mode configurations.

Figure 6A:
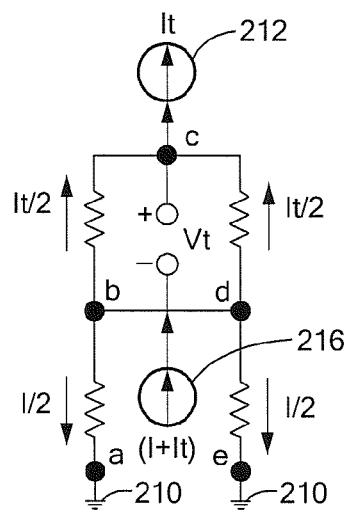
FIG. 6A is a schematic diagram showing an equivalent circuit of the vertical Hall element of FIG. 6 when coupled in the second self-test mode configuration.
Figure 7:
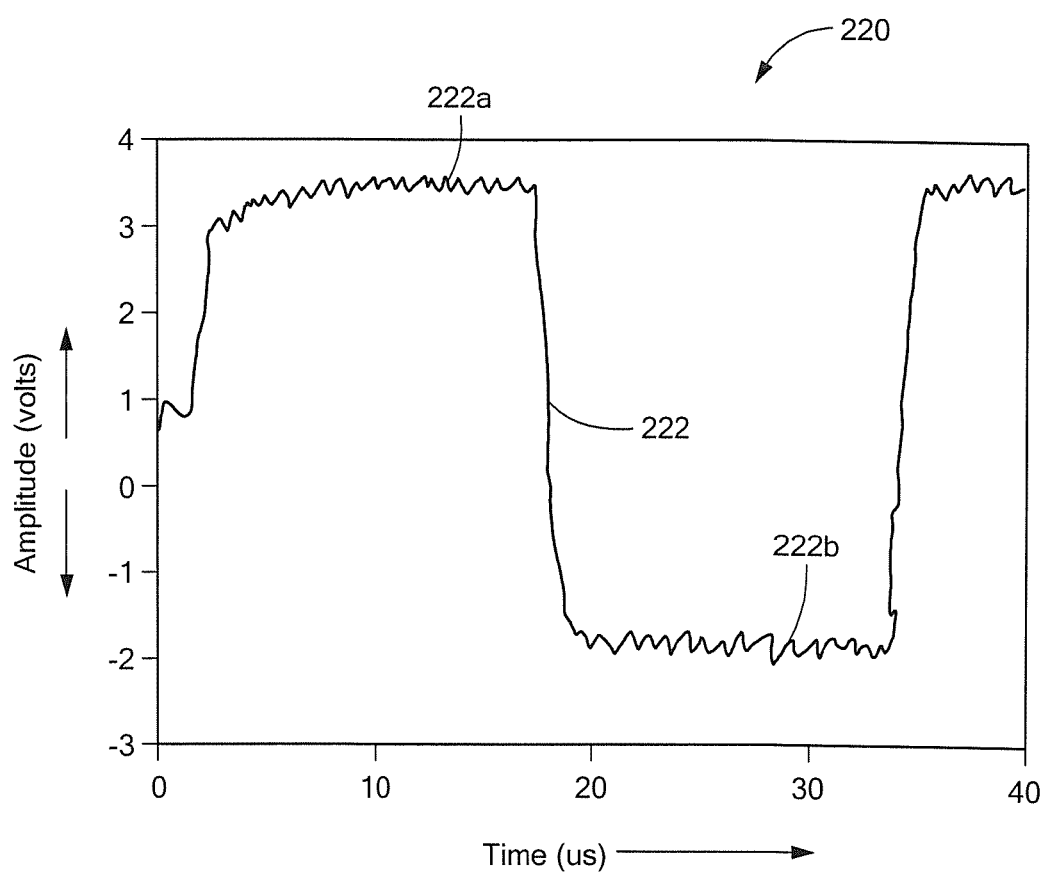
FIG. 7 is a graph showing a signal within the magnetic field sensor of FIG. 3 when the CVH sensing element of FIG. 3 is alternately coupled in the first and second self-test mode configurations of FIGS. 5 and 6.

Referring now to FIG. 7, a graph 220 has a horizontal axis with units of time in microseconds and a vertical axis with a scale in units of amplitude in units of volts. A signal 222 has high states 222a and low states 222b. The signal 222 corresponds to the square wave described above in conjunction with FIG. 6A as may be present during the self-test mode at the amplifier 92 of FIG. 3, and as may be representative of the signal 92a when the magnetic field sensor 70 is in the self-test mode, and changing between the first and second self-test mode configurations.

The signal 222 is filtered by the band pass filter 94 of FIG. 3, which can remove ripple and higher harmonics to result in the filtered signal 94a being a sine wave, just as it would be if the magnetic field sensor 70 of FIG. 3 were experiencing a magnetic field.

The signal 222 can be representative of about half of the vertical Hall elements in the CVH sensing element 72 being in the first self-test mode configuration of FIG. 5, followed by the other half of the vertical Hall elements in the CVH sensing element 72 being in the second self-test mode configuration of FIG. 6.

However, it should be apparent that the signal 222 can also be representative, for example, of any number, including one, of the vertical Hall elements being in the first self-test mode configuration, followed by any number, including one (e.g., the same one) of the vertical Hall elements being in the second self-test mode configuration. In one particular embodiment, the signal 222 can be representative, for example, of one of the vertical Hall elements being in the first self-test mode configuration, followed by another one of the vertical Hall elements being in the second self-test mode configuration.

In view of voltage equations for the first and second self-test mode configurations described above in conjunction with FIGS. 5A and 6A, it will be apparent that a magnitude of the signal 222, i.e., the amplitude of the two states of the signal 222, is related resistances between vertical Hall element contacts. Where more than one vertical Hall element is used to generate each one of the two states of the signal 222, then an abnormality of a resistance of one of the vertical Hall elements can show up as a deviation in part of one of the states of the signal 222. However, when only one vertical Hall element is used to generate each one of the two states of the signal 222, then an abnormality of a resistance of the vertical Hall element can show up as a deviation in amplitude of both of the entire states of the signal 222. Furthermore, when two vertical Hall element are used to generate the two states, respectively, of the signal 222, then an abnormality of a resistance of one of the vertical Hall elements can show up as a deviation in amplitude of one of the entire states of the signal 222.

It is desirable to test in a self-test mode all of the circuitry of the magnetic field sensor 70 of FIG. 3. It should be apparent that use of both the first and second self-test mode configurations allows for the square wave signal 222 to be generated, which can be representative of the CVH sensing element 72 of FIG. 3 experiencing an external magnetic field, but without any actual magnetic field. Thus, use of both the first and second self-test mode configurations allows for not only the CVH sensing element to be tested, but also for the x-y direction component circuit 90 of FIG. 3 to be tested.

A phase of the signal 222 can be varied in a number of steps corresponding to a number of vertical Hall elements in the CVH sensing element 72 of FIG. 3 by selecting which ones of the vertical Hall elements (including one or more vertical Hall elements) are coupled in the first self-test mode configuration and which ones (including one or more vertical Hall elements) of the vertical Hall elements are coupled in the second self-test mode configuration. Since the phase of the signal 222 is representative of an angle of an external magnetic field experienced by the CVH sensing element 72, a plurality of different simulated angles can be tested.

In some embodiments, it is possible to use only one or the other of the first or second self-test mode configuration of FIG. 5 or 6, respectively. In these embodiments, the current, It, could instead be alternated between two values to generate a square wave like the signal 222 of FIG. 7. More than two values of the current, It, can also be used to generate a non-square signal.

For some embodiments, particularly for embodiments that employ one (or two) vertical Hall element at a time in the first and second self-test mode configurations, the output voltage level is representative of the resistances between vertical Hall element contacts of the CVH sensing element, which resistances are shown in FIGS. 5 and 6. Thus, variations of this voltage among the vertical Hall elements of the CVH sensing element 72, sensed within the x-y magnitude signal 136a of FIG. 3 by the self-test processor 166, can be used to identify resistances that are outside of predetermined resistance limits, which may be indicative of a failed CVH sensing element.

While the signal 222 is shown to be asymmetrical about zero volts, in a preferred embodiment, the signal 222 is symmetrical about zero volts.

Figure 8:
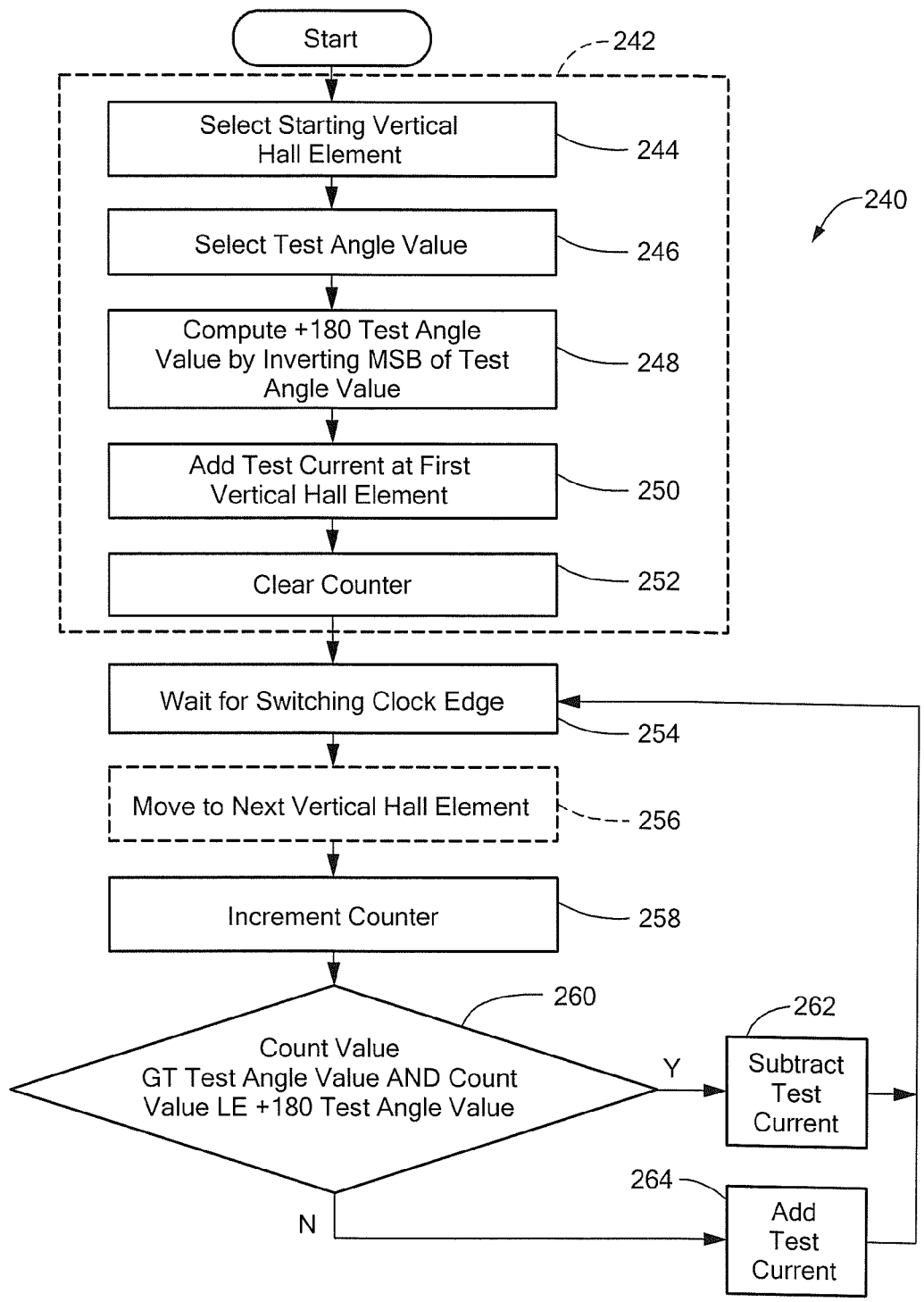
FIG. 8 is a flow chart showing a self-test process that can sequence the CVH sensing element of FIG. 3 between the first and second self-test mode configurations.
Figure 10:
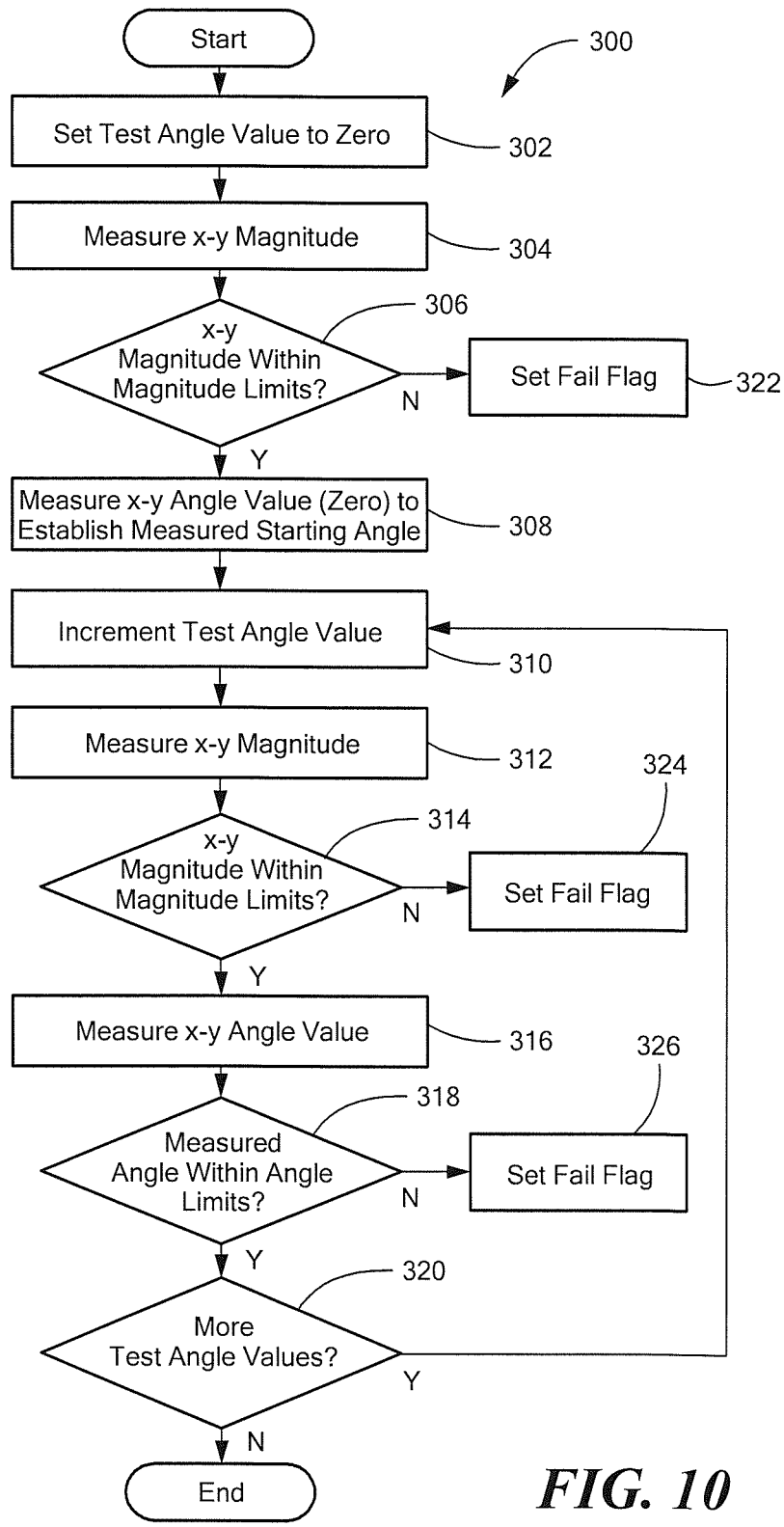
FIG. 10 is a flow chart showing a self-test process that can be performed by the self-test processor of the magnetic field sensor of FIG. 3.

FIGS. 8 and 10 show flowcharts corresponding to the below contemplated technique which would be implemented in a computer processor (e.g., the self-test processor 166 of FIG. 3). Rectangular elements (typified by element 244 in FIG. 8), herein denoted "processing blocks," represent computer software instructions or groups of instructions. Diamond shaped elements (typified by element 260 in FIG. 8), herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Referring now to FIG. 8, a method of sequencing the CVH sensing element 72 of FIG. 3 between the first and second self-test mode configurations includes initialization steps 242.

At block 244, a starting vertical Hall element within the CVH sensing element 72 of FIG. 3 is selected.

At block 246 a test angle value is selected. The test angle value is representative of an angle of a magnetic field, relative to a position of the CVH sensing element 72, that can be represented by the self-test mode of the process 240.

At block 248, a +180 test angle value is computed. The +180 test angle value can be computed by inverting the most significant bit (MSB) of the test angle value selected at block 246.

At block 250, a test current is added at the first vertical Hall element. In other words, the current source 216 of FIGS. 6 and 6A is used in the second self-test mode configuration shown in FIGS. 6 and 6A, wherein a value of the current source 216 is I+It.

At block 252, a counter is cleared to zero.

At block 254 the process 240 waits for a switching clock edge, for example, in the switch control signals 82a corresponding to sequencing around the CVH sensing element 72 associated with the switching circuit 74.

At block 256, optionally, upon detection of the switching clock edge at block 254, the process 240 can move to a next vertical Hall element.

At block 258, the counter cleared at block 252, is incremented by one.

At block 260, if the count value, i.e. the value in the counter, is greater than the test angle value selected at block 246, and, if the count value is less than the +180 test angle value calculated a block 248, then the process 240 proceeds to block 262.

At block 262, the self-test mode is changed by operation of the switching circuit 76 of FIG. 3, to the first self-test mode configuration described above in conjunction with FIGS. 5 and 5A, where the test current, It, is subtracted, and wherein the current source 214 has a current value I–It. The process then returns to block 254 to wait for next edge of the switching clock.

At block 260, if the count value, i.e. the value in the counter, is not greater than the test angle value selected at block 246, and, if the count value is not less than the +180 test angle value calculated a block 248, then the process proceeds to block 264. At block 264, the test current, It, is added, resulting in or continuing in the second self-test mode configuration according to FIGS. 6 and 6A.

The method 240 can be repeatedly operated by selecting different values of the test angle value at block 246. Alternatively, the entire self-test can be run with one test angle value. With but one test angle value the entire magnetic field sensor 70 of FIG. 3 cannot be tested.

If block 256 is omitted, then the entire self-test of the method 240 is run using but one of the vertical Hall elements of the CVH sensing element 72 of FIG. 3.

The method 240 of FIG. 8 is graphically described below in conjunction with FIG. 9.

Figure 9:
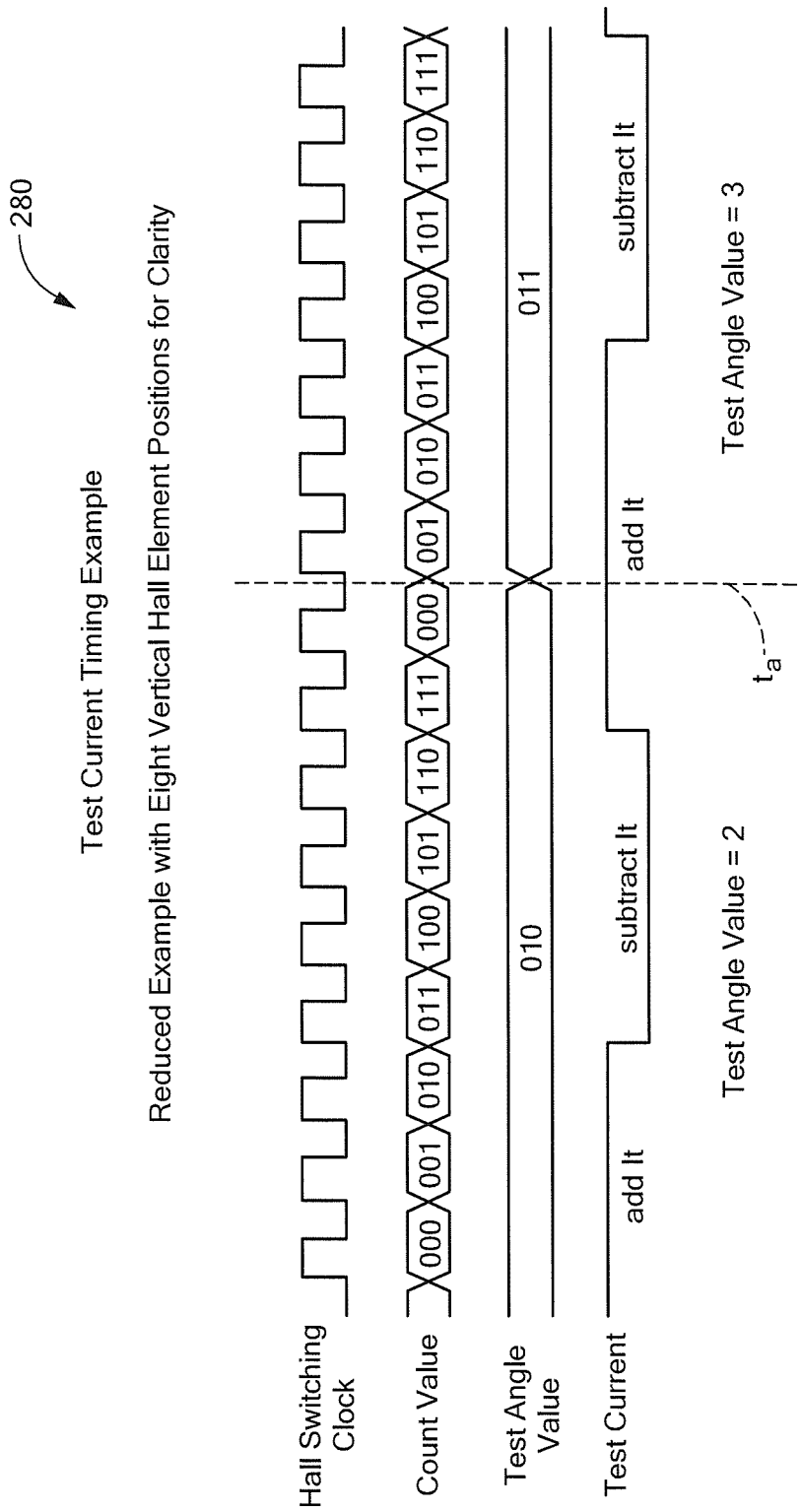
FIG. 9 is a graph showing waveforms of the magnetic field sensor of FIG. 3 in accordance with the process of FIG. 8.

Referring now to FIG. 9, a Hall switching clock is representative of one of the switching control signals 82a of FIG. 3 that corresponds to switching operation of the switching circuit 74 of FIG. 3, which steps in a sequence around the CVH sensing element 72.

Count values correspond to values in the counter discussed above in conjunction with FIG. 8 at blocks 252, 258.

Test angle values correspond to a test angle value described above in conjunction with FIG. 8. The test angle value can be changed as described above in conjunction with FIG. 8. Here is shown this test angle value changes at a time, $t_a$, from a value of two to a value of three. This change is representative of a simulated magnetic field at the CVH sensing element 72 of FIG. 3 rotating relative to the CVH sensing element.

A test current signal is representative of times when the test current, It, is added in the second self-test mode configuration in accordance with FIGS. 6 and 6A is, or subtracted in the first self-test mode configuration in accordance with FIGS. 5 and 5A.

From the discussion above in conjunction with FIG. 7, it should be understood that the signal 92a of FIG. 3 has a phase relationship corresponding to a phase of the test current signal shown in FIG. 9.

By mapping values shown in FIG. 9 against the method 240 of FIG. 8, it can be seen that the signals of FIG. 9 correspond to the method 240.

Referring now to FIG. 10, a method 300 begins at step 302, where a test angle value can be initialized, for example, to have a value of zero. Again, the test angle value corresponds to an angle of a simulated magnetic field experienced by the CVH sensing element 72 of FIG. 3.

At block 304, an x-y magnitude can be measured, for example by the x-y direction component circuit 90 of FIG. 3. In particular, the x-y magnitude signal 136a results. In order to measure the magnitude, the switching circuit 74 of FIG. 3 sequences through the vertical Hall elements of the CVH sensing element 72.

At block 306, the x-y magnitude measured at block 304 is inspected, for example by the self-test processor 166 of FIG. 3. At block 304 if the x-y magnitude is within acceptable magnitude limits, which are predetermined, the process proceeds to block 308.

At block 308, the x-y angle value, i.e. the signal 100a of FIG. 3, is measured in order to establish a measured starting angle.

At block 310, the test angle value is incremented.

At block 312, the x-y magnitude, i.e. the x-y magnitude signal 136a of FIG. 3 is again measured.

At block 314, the x-y magnitude measured at block 312 is inspected, for example by the self-test processor 166 of FIG. 3. At block 314, if the x-y magnitude measured at block 312 is within acceptable magnitude limits, which are predetermined, the process proceeds to block 316.

At block 316, the x-y angle value, i.e. the signal 100a of FIG. 3, is measured. In order to measure the x-y angle value, the switching circuit 74 of FIG. 3 sequences through the vertical Hall elements of the CVH sensing element 72.

At block 318, the measured angle, measured at block 316, is inspected, for example, by the self-test processor 166 of FIG. 3. If, at block 318, the measured angle is within a certain angle limits, which are predetermined, and the process continues to block 320.

At block 320, it is determined if there are more test angle values for consideration. The method 300 can use test angle values corresponding to rotation of a simulated magnetic field about the CVH sensing element 72 by about 360 degrees. However, in other embodiments the self-test can continue and can simulate a rotation of the magnetic field about the CVH sensing element 72 through several rotations of 360 degrees. At block 320, if there are more test angle values to be considered, then the method 300 can return, for example, to block 310.

If, at block 306, 314, 318, any of the tests fail, then at corresponding blocks 322, 324, 326, a fail flag can be set, which can correspond to the self-test signal 166a of FIG. 3. In other embodiments the fail flags of block 322, 324 326 can be different fail flags, in which case the self-test signal 166a of FIG. 3 can be indicative of which one of the tests of blocks 306, 314, 318 failed.

The method 300 provides a rotation of the simulated magnetic field experienced by the CVH sensing element 72. It should be recognized that the self-test method 300 allows for self-test of all of or nearly all of the magnetic field sensor 70 of FIG. 3 but without use of any magnetic field.

Figure 11:
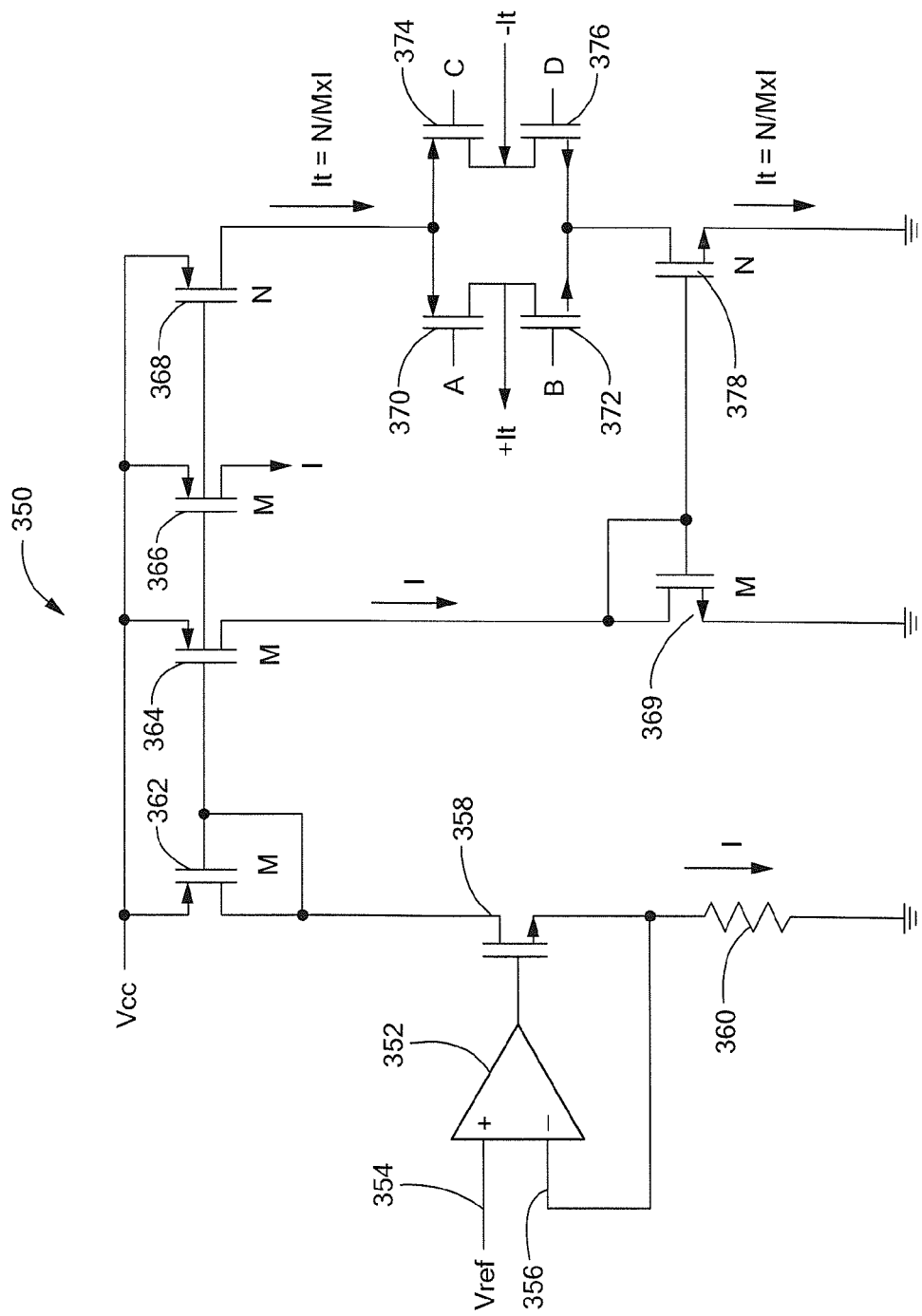
FIG. 11 is a schematic diagram showing current sources that can be used by the magnetic field sensor of FIG. 3 when in the first and second self-test mode configurations.

Referring now to FIG. 11, a circuit 350 can provide the current sources 84 of FIG. 3 and can provide current sources used in the first and second self-test mode configurations of FIGS. 5 and 5A and FIGS. 6 and 6A, respectively.

The circuit 350 can include a current sink comprises an amplifier 352 of field effect transistor (FET) 358 and a resistor 360 coupled in a feedback arrangement is shown. A plurality of current mirrors comprised of FETS 362, 364, 366, 368 provide other currents. Referring briefly to FIGS. 5, 5A, 6, and 6A, it will be recognized that currents I, +It, and −It are needed in order to generate the first and second self-test mode configurations.

The FET 366 can provide the current I.

FET switches 370, 372, 374, 376 are selectively closed to provide the current +It and the current −It.

While both first and second self-test mode configuration are shown and described above, it should be understood that, in some embodiments, as described above in conjunction with FIG. 7, only one of the first of the second self-test mode configurations are used and the current, It, is alternated between two or more values.

Also, from discussion above, it should be apparent that the self-test can employ any number of the vertical Hall elements within the CVH sensing element 72 of FIG. 3, including one vertical Hall element and including all of the vertical Hall elements.

The above-described self-test functions can be run at any time, including during manufacture and including when the magnetic field sensor 70 of FIG. 3 is installed in an application. When installed, it may be desirable to perform the self-test form time to time, for example, once per minute or once per hour.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
 a circular vertical Hall (CVH) sensing element comprising:
  a plurality of vertical Hall element contacts arranged over a common implant region in a substrate; and
  a plurality of vertical Hall elements, each vertical Hall element comprised of a respective group of vertical Hall element contacts selected from among the plurality of vertical Hall element contacts, the magnetic field sensor further comprising;
  switching network comprising a plurality of connection nodes, a portion of the plurality of connection nodes coupled to the plurality of Hall element contacts; and
  a plurality of drive circuits, another portion of the plurality of connection nodes coupled to the plurality of drive circuits, wherein the switching network is operable to couple the plurality of drive circuits to selected vertical Hall element contacts of at least a first one of the plurality of vertical Hall elements, and operable to switch into a normal mode configuration and into a first self-test mode configuration associated with the at least first one of the plurality of vertical Hall elements, wherein, when in the normal mode configuration, the at least first one of the plurality of vertical Hall elements provides a respective normal mode voltage between vertical Hall element contacts of the at least first one of the plurality of vertical Hall elements, the normal mode voltage responsive to a magnetic field, wherein, when in the first self-test mode configuration, the at least first one of the plurality of vertical Hall elements provides a respective first self-test voltage between a respective selected pair of vertical Hall element contacts of the at least first one of the plurality of vertical Hall elements, wherein the first self-test voltage is related to a resistance between vertical Hall element contacts of the at least first one of the plurality of vertical Hall elements, respectively, wherein the first self-test voltage has little or no response to the magnetic field.

2. The magnetic field sensor of claim 1, wherein the switching network is further operable to change the first self-test mode configuration to a second different self-test mode configuration by altering a coupling to the plurality of drive circuits, wherein, when in the second self-test mode configuration, the at least first one of the plurality of vertical Hall elements provides a respective second self-test voltage between the respective selected pair of vertical Hall element contacts of the at least first one of the plurality of vertical Hall elements, wherein the second self-test voltage is also related to the resistance between vertical Hall element contacts of the at least first one of the plurality of vertical Hall elements, respectively, wherein the second self-test voltage has little or no response to the magnetic field.

3. The magnetic field sensor of claim 2, wherein the first self-test voltage and the second self-test voltage are substantially opposite voltages relative to a bias voltage.

4. The magnetic field sensor of claim 2, further comprising a self-test processor coupled to the switching network and configured to cause the switching network to provide the first and second self-test mode configurations to the at least first one of the plurality of vertical Hall elements at different times selected to result in a simulated rotation of a simulated magnetic field.

5. The magnetic field sensor of claim 2, wherein the switching network is further operable to switch to each one of the plurality of vertical Hall elements and to generate the normal mode configuration, the first self-test mode configuration, and the second self-test mode configuration associated with each one of the plurality of vertical Hall elements.

6. The magnetic field sensor of claim 2, wherein the respective selected pair of vertical Hall element contacts is an adjacent pair of vertical Hall element contacts.

7. The magnetic field sensor of claim 2, wherein the switching network operable to switch into the second self-test mode configuration when the magnetic field sensor is installed in an application.

8. The magnetic field sensor of claim 1, wherein the switching network is further operable to switch to at least as second one of the plurality of vertical Hall elements and to switch into the normal mode configuration and into a second different self test mode configuration associated with the at least second one of the plurality of vertical Hall elements by altering a coupling to the plurality of drive circuits, wherein, when in the normal mode configuration, the at least second one of the plurality of vertical Hall elements provides a respective normal mode voltage between vertical Hall element contacts of the at least second one of the plurality of vertical Hall elements, the normal mode voltage responsive to a magnetic field, wherein, when in the second different self test mode configuration, the at least second one of the plurality of vertical Hall elements provides a respective second self-test voltage between a respective selected pair of vertical Hall element contacts of the at least second one of the plurality of vertical Hall elements, wherein the second self-test voltage is also related to a resistance between vertical Hall element contacts of the at least second one of the plurality of vertical Hall elements, respectively, wherein the second self-test voltage has little or no response to the magnetic field.

9. The magnetic field sensor of claim 8, wherein the first self-test voltage and the second self-test voltage are substantially opposite voltages relative to a bias voltage.

10. The magnetic field sensor of claim 8, further comprising a self-test processor coupled to the switching network and configured to cause the switching network to provide the first self-test mode configuration to the at least first one of the plurality of vertical Hall elements and to provide the second self-test mode configuration to the at least second one of the plurality of vertical Hall elements at different times selected to result in a simulated rotation of a simulated magnetic field.

11. The magnetic field sensor of claim 8, wherein the switching network is further operable to switch to each one of the plurality of vertical Hall elements and to generate the normal mode configuration associated with each one of the plurality of vertical Hall elements, the first self-test mode configuration associated with a first portion of the plurality of vertical Hall elements, and the second self-test mode configuration associated with a second different portion of the plurality of vertical Hall elements.

12. The magnetic field sensor of claim 1, wherein the at least first one of the plurality of vertical Hall elements comprises a first vertical Hall element, wherein the first vertical Hall element comprises a respective first vertical Hall element contact, a respective second vertical Hall element contact proximate to the first vertical Hall element contact, a respective third vertical Hall element contact proximate to the second vertical Hall element contact, a respective fourth vertical Hall element contact proximate to the third vertical Hall element contact, and a respective fifth vertical Hall element contact proximate to the fourth vertical Hall element contact from among the plurality of vertical Hall element contacts, wherein, when in the first self-test mode configuration, the first vertical Hall element contact is coupled to a reference voltage, the second vertical Hall element contact is coupled to the fourth vertical Hall element contact and each is coupled to receive a respective first current from the plurality of drive circuits, the third vertical Hall element contact is coupled to receive a second current from the plurality of drive circuits, the fifth vertical Hall element contact is coupled to the reference voltage, and the first self-test voltage results between the second and third vertical Hall element contacts and between the fourth and third vertical Hall element contacts.

13. The magnetic field sensor of claim 12, wherein the second current has a value equal to a self-test current value and the first current has a value equal to a difference between a bias current value and the self-test current value.

14. The magnetic field sensor of claim 13, wherein the bias current value and the self-test current value are selected to result in the first self-test voltage being within a predetermined voltage range.

15. The magnetic field sensor of claim 13, wherein the second current is inverted in direction from time to time to provide the first self-test voltage at a first time and a second different self-test voltage at a second different time.

16. The magnetic field sensor of claim 15, wherein the bias current value and the self-test current value are selected to result in the first and second self-test voltages being within a predetermined voltage range.

17. The magnetic field sensor of claim 1, wherein the normal mode configuration comprises first, second, third, and fourth normal mode configurations to provide a chopping of the at least first one of the plurality of vertical Hall elements.

18. The magnetic field sensor of claim 1, further comprising an x-y direction component circuit coupled to receive a signal representative of an output signal from the CVH sensing element, wherein the x-y direction component circuit is configured to generate an x-y angle signal representative of a direction of a magnetic field experienced by the CVH sensing element.

19. The magnetic field sensor of claim 18, further comprising a self-test processor coupled to receive the x-y angle signal and configured to generate a fail flag value in accordance the x-y angle signal, wherein the fail flag value is indicative of the x-y angle signal being outside of selected limits.

20. The magnetic field sensor of claim 18, wherein the x-y direction component circuit is also configured to generate an x-y magnitude signal representative of a magnitude of the magnetic field.

21. The magnetic field sensor of claim 20, further comprising a self-test processor coupled to receive at least one of the x-y angle signal or the x-y magnitude signal and configured to generate a fail flag value in accordance with at least one of the x-y angle signal or the x-y magnitude signal, wherein the fail flag value is indicative of at least one of the x-y angle signal or the x-y magnitude signal being outside of respective selected limits.

22. The magnetic field sensor of claim 1, further comprising an x-y direction component circuit coupled to receive a signal representative of an output signal from the CVH sensing element, wherein the x-y direction component circuit is configured to generate an x-y magnitude signal representative of a magnitude of the magnetic field.

23. The magnetic field sensor of claim 22, further comprising a self-test processor coupled to receive the x-y magnitude signal and configured to generate a fail flag value in accordance with the x-y magnitude signal, wherein the fail flag value is indicative of the x-y magnitude signal being outside of selected limits.

24. The magnetic field sensor of claim 1, wherein the respective selected pair of vertical Hall element contacts is an adjacent pair of vertical Hall element contacts.

25. The magnetic field sensor of claim 1, wherein the switching network is operable to switch into the first self-test mode configuration when the magnetic field sensor is installed in an application.

26. A method of self-testing a magnetic field sensor having a circular vertical Hall (CVH) sensing element comprising a plurality of vertical Hall element contacts arranged over a common implant region in a substrate and comprising a plurality of vertical Hall elements, each vertical Hall element comprised of a respective group of vertical Hall element contacts selected from among the plurality of vertical Hall element contacts, the method comprising:
coupling a plurality of drive circuits to selected vertical Hall element contacts of at least a first one of the plurality of vertical Hall elements, wherein the coupling the plurality of drive circuits comprises:
switching the couplings at a first selected time into a normal mode configuration associated with the at least first one of the plurality of vertical Hall elements; and
switching the couplings at a second different selected time into a first self-test mode configuration associated with the at least first one of the plurality of vertical Hall elements,
wherein, when in the normal mode configuration, the at least first one of the plurality of vertical Hall elements provides a respective normal mode voltage between vertical Hall element contacts of the at least first one of the plurality of vertical Hall elements, the normal mode voltage responsive to a magnetic field,
wherein, when in the first self-test mode configuration, the at least first one of the plurality of vertical Hall elements provides a respective first self-test voltage between a respective selected pair of vertical Hall element contacts of the at least first one of the plurality of vertical Hall elements, wherein the first self-test voltage is related to a resistance between vertical Hall element contacts of the at least first one of the plurality of vertical Hall elements, respectively, wherein the first self-test voltage has little or no response to the magnetic field.

27. The method of claim 26, further comprising:
switching the couplings at a third different selected time into a second self-test mode configuration associated with the at least first one of the plurality of vertical Hall elements, wherein, when in the second self-test mode configuration, the at least first one of the plurality of vertical Hall elements provides a respective second self-test voltage between the respective selected pair of vertical Hall element contacts of the at least first one of the plurality of vertical Hall elements, wherein the second self-test voltage is also related to the resistance between vertical Hall element contacts of the at least first one of the plurality of vertical Hall elements, respectively, wherein the second self-test voltage has little or no response to the magnetic field.

28. The method of claim 27, wherein the first self-test voltage and the second self-test voltage are substantially opposite voltages relative to a bias voltage.

29. The method of claim 27, further comprising:
switching the at least a first one of the plurality of vertical Hall elements into the first self-test mode configuration; and
switching the at least a first one of the plurality of vertical Hall elements into the second self-test mode configuration at different times selected to result in a simulated rotation of a simulated magnetic field.

30. The method of claim 27, wherein the respective selected adjacent pair of vertical Hall element contacts is an adjacent pair of vertical Hall element contacts.

31. The method of claim 27, wherein the third different selected time is a time during which the magnetic field sensor is installed in an application.

32. The method of claim 26, further comprising:
coupling the plurality of drive circuits to selected vertical Hall element contacts of at least a second one of the plurality of vertical Hall elements, wherein the coupling the plurality of drive circuits to the selected vertical Hall element contacts of the at least a second one of the plurality of vertical Hall elements comprises:

switching the couplings at a third different selected time into the normal mode configuration associated with the second one of the plurality of vertical Hall elements; and switching the couplings at a fourth different selected time into a second self-test mode configuration associated with the second one of the plurality of vertical Hall elements, wherein, when in the normal mode configuration, the at least second one of the plurality of vertical Hall elements provides a respective normal mode voltage between vertical Hall element contacts of the at least second one of the plurality of vertical Hall elements, the normal mode voltage responsive to a magnetic field, wherein, when in the second different self-test mode configuration, the at least second one of the plurality of vertical Hall elements provides a respective second self-test voltage between a respective selected pair of vertical Hall element contacts of the at least second one of the plurality of vertical Hall elements, wherein the second self-test voltage is also related to a resistance between vertical Hall element contacts of the at least second one of the plurality of vertical Hall elements, respectively, wherein the second self-test voltage has little or no response to the magnetic field.

33. The method of claim 32, wherein the first self-test voltage and the second self-test voltage are substantially opposite voltages relative to a bias voltage.

34. The method of claim 32, wherein the coupling the plurality of drive circuits cormprises:

generating the first self-test mode configuration associated with as first portion of the plurality of vertical Hall elements; and generating the second self-test mode configuration associated with a second different portion of the plurality of vertical Hall elements at different times selected to result in a simulated rotation of a simulated magnetic field.

35. The method of claim 26, wherein the at least first one of the plurality of vertical hall elements comprises a first vertical Hall element, wherein the first vertical Hall elements comprises a respective first vertical Hall element contact, a respective second vertical Hall element contact proximate to the first vertical Hall element contact, a respective third vertical Hall element contact proximate to the second vertical Hall element contact, a respective fourth vertical Hall element contact proximate to the third vertical Hall element contact, and a respective fifth vertical Hall element contact proximate to the fourth vertical Hall element contact from among the plurality of vertical Hall element contacts, wherein the method further comprises:

when in the first self-test mode configuration, coupling the first vertical Hall element contact to a reference voltage;

coupling the second vertical Hall element contact to the fourth vertical Hall element contact and coupling each to receive as respective first current;

coupling the third vertical Hall element contact to receive a second current and coupling the fifth vertical Hall element contact to the reference voltage, wherein the first self-test voltage results between the second and third vertical Hall element contacts and between the fourth and third vertical Hall element contacts.

36. The method of claim 35, wherein the second current has a value equal to a self-test current value and the first current has a value equal to as difference between a bias current value and the self-test current value.

37. The method of claim 36, wherein the bias current value and the self-test current value are selected to result in the first self-test voltage being within a predetermined voltage range.

38. The method of claim 36, further comprising:

inverting the second current in direction from time to time to provide the first self-test voltage at a first time and a second different self-test voltage at a second different time.

39. The method of claim 38, wherein the bias current value and the self-test current value are selected to result in the first and second self-test voltages being within a predetermined voltage range.

40. The method of claim 26, wherein the normal mode configuration comprises first, second, third, and fourth normal mode configurations to provide a chopping of the at least first one of the plurality of vertical Hall elements.

41. The method of claim 26, further comprising:

generating an x-y angle signal representative of a direction of a magnetic field experienced by the CVH sensing element.

42. The method of claim 41, further comprising:

generating a fail flag value in accordance with the x-y angle signal, wherein the fail flag value is indicative of the x-y angle signal being outside of selected limits.

43. The method of claim 41, further comprising:

generating an x-y magnitude signal representative of a magnitude of the magnetic field.

44. The method of claim 43, further comprising:

generating a fail flag value in accordance with the x-y magnitude signal, wherein the fail flag value is indicative of the x-y magnitude signal being outside of selected limits.

45. The method of claim 26, further comprising:

generating an x-y magnitude signal representative of a magnitude of the magnetic field.

46. The method of claim 45, further comprising:

generating a fail flag value in accordance with at least one of the x-y angle signal or the x-y magnitude signal, wherein the fail flag value is indicative of at least one of the x-y angle signal or the x-y magnitude signal being outside of respective selected limits.

47. The method of claim 26, wherein the respective selected pair of vertical Hall element contacts is an adjacent pair of vertical Hall element contacts.

48. The method of claim 26, wherein the second different selected time is a time during which the magnetic field sensor is installed in an application.

* * * * *

UNITED STATES PATENT AND TRADEMARK OFFICE
CERTIFICATE OF CORRECTION

PATENT NO. : 8,890,518 B2
APPLICATION NO. : 13/155731
DATED : November 18, 2014
INVENTOR(S) : Steven Daubert It is certified that error appears in the above-identified patent and that said Letters Patent is hereby corrected as shown below:

In the specification

Column 3, Line 65 delete "a least" and replace with --at least--.

Column 4, Line 1 delete "diagram" and replace with --diagrams--.

Column 8, Line 43 delete "elements" and replace with --element--.

Column 9, Line 60 delete "generated" and replace with --generate--.

Column 9, Line 64 delete "configure" and replace with --configured--.

Column 10, Line 19 delete "use" and replace with --user--.

Column 11, Line 34 delete "vertical a Hall" and replace with --vertical Hall--.

Column 11, Line 53 delete "Hal" and replace with --Hall--.

Column 13, Line 55 delete ", is has" and replace with --, has--.

Column 14, Line 50 delete ", is related resistances" and replace with --, is related to resistances--.

Column 14, Line 60 delete "element" and replace with --elements--.

Column 16, Line 33 delete "a" and replace with --at--.

Column 16, Line 40 delete "for next" and replace with --for the next--.

Column 16, Line 45 delete "a" and replace with --at--.

Column 17, Line 8 delete "FIGS. 6 and 6A is," and replace with --FIGS. 6 and 6A,--.

Column 17, Line 51 delete "is within a certain" and replace with --is within certain--.

Signed and Sealed this
Twenty-ninth Day of December, 2015

Michelle K. Lee
*Director of the United States Patent and Trademark Office*

CERTIFICATE OF CORRECTION (continued)
U.S. Pat. No. 8,890,518 B2

In the specification

Column 18, Line 13 delete "sink comprises" and replace with --sink that comprises--.

Column 18, Line 24 delete "configuration" and replace with --configurations--.

Column 18, Line 39 delete "form" and replace with --from--.

Column 18, Line 48 delete "that that" and replace with --that the--.

In the claims

Column 19, Line 60 delete "operable" and replace with --is operable--.

Column 19, Line 64 delete "at least as" and replace with --at least a--.

Column 21, Lines 27-28 delete "accordance the" and replace with --accordance with the--.

Column 22, Line 25 delete "Hail" and replace with --Hall--.

Column 23, Line 34 delete "as" and replace with --a--.

Column 23, Line 57 delete "as" and replace with --a--.

Column 23, Line 59 delete "current and" and replace with --current; and--.